(12) United States Patent
Dutta et al.

(10) Patent No.: US 8,787,088 B2
(45) Date of Patent: Jul. 22, 2014

(54) OPTIMIZED ERASE OPERATION FOR NON-VOLATILE MEMORY WITH PARTIALLY PROGRAMMED BLOCK

(75) Inventors: Deepanshu Dutta, San Jose, CA (US); Ken Oowada, Fujisawa (JP); Koichi Nishimura, Kanagawa (JP); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 202 days.

(21) Appl. No.: 13/537,551

(22) Filed: Jun. 29, 2012

(65) Prior Publication Data
US 2014/0003147 A1 Jan. 2, 2014

(51) Int. Cl.
*G11C 11/34* (2006.01)

(52) U.S. Cl.
USPC .............. 365/185.11; 365/185.22; 365/185.29

(58) Field of Classification Search
USPC ........................ 365/185.11, 185.22, 185.29
See application file for complete search history.

(56) References Cited

U.S. PATENT DOCUMENTS

| | | | |
|---|---|---|---|
| 6,643,181 B2 | 11/2003 | Sofer et al. | |
| 6,928,001 B2 | 8/2005 | Avni et al. | |
| 7,468,926 B2 | 12/2008 | Shappir et al. | |
| 7,545,678 B2 | 6/2009 | Lee et al. | |
| 7,606,100 B2 | 10/2009 | Hemink et al. | |
| 8,130,551 B2 | 3/2012 | Oowada et al. | |
| 8,218,367 B2 * | 7/2012 | Hemink et al. | .......... 365/185.22 |
| 2005/0057997 A1 | 3/2005 | Mitani et al. | |
| 2005/0078522 A1 | 4/2005 | Abedifard et al. | |
| 2010/0039864 A1 | 2/2010 | Sarin et al. | |
| 2010/0091578 A1 | 4/2010 | Kim et al. | |
| 2011/0242899 A1 | 10/2011 | Oowada et al. | |
| 2012/0081964 A1 | 4/2012 | Li | |

OTHER PUBLICATIONS

International Search Report & The Written Opinion of the International Searching Authority dated Sep. 5, 2013, International Patent Application No. PCT/US2013/039299.

* cited by examiner

*Primary Examiner* — Son Dinh
*Assistant Examiner* — Nam Nguyen
(74) *Attorney, Agent, or Firm* — Vierra Magen Marcus LLP

(57) ABSTRACT

In connection with an erase operation of a block of non-volatile storage elements, a determination is made as to whether the block is partially but not fully programmed. A degree of partial programming can be determined by a pre-erase read operation which determines a highest programmed word line, or which determines whether there is a programmed storage element in a subset of word lines above a small subset of source side word lines. Since a partially programmed block will pass an erase-verify test more easily than a fully programmed block, a measure is taken to ensure that the block is sufficiently deeply erased. In one approach, an erase-verify test is made stricter by adjusting a sensing parameter when the block is partially programmed. In another approach, the block can be programmed before being erased. Or, an extra erase pulse which is not followed by an erase-verify test can be applied.

20 Claims, 23 Drawing Sheets

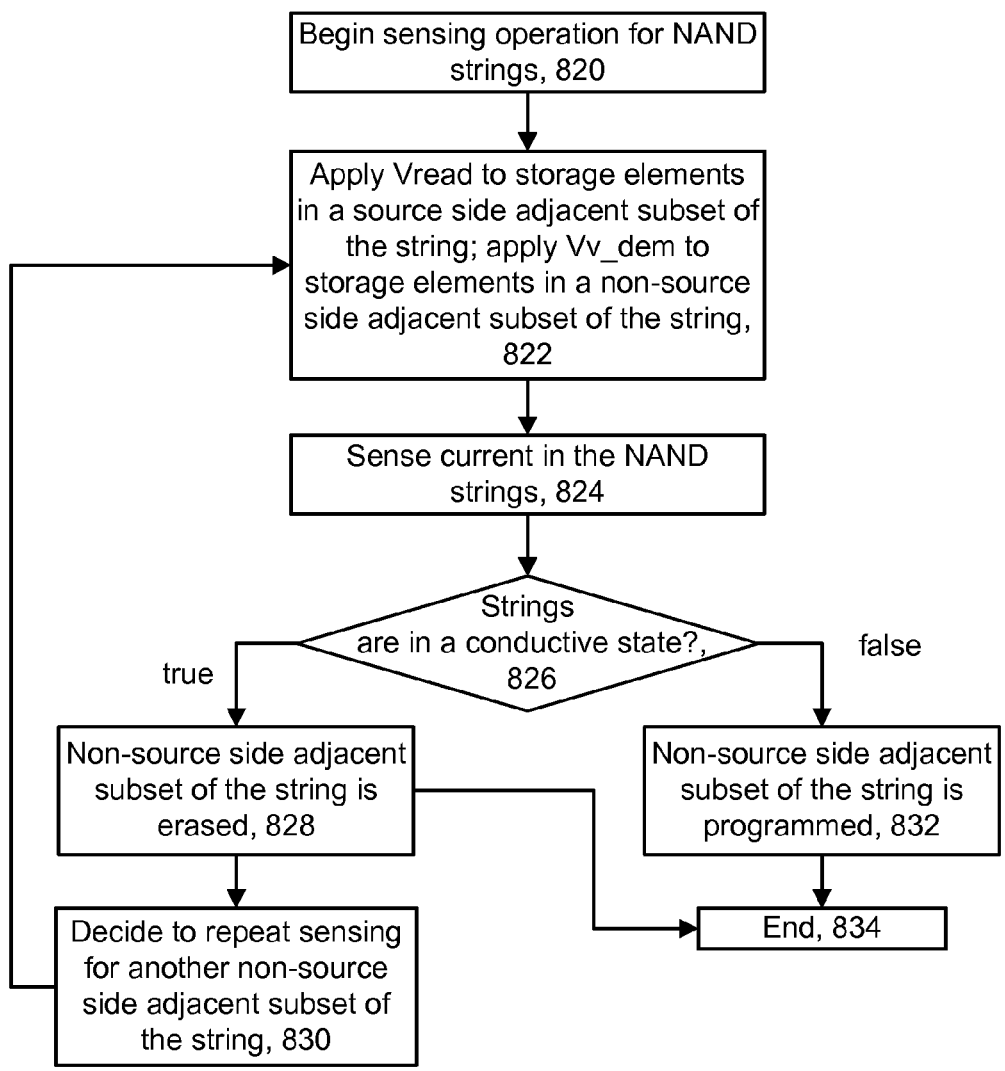

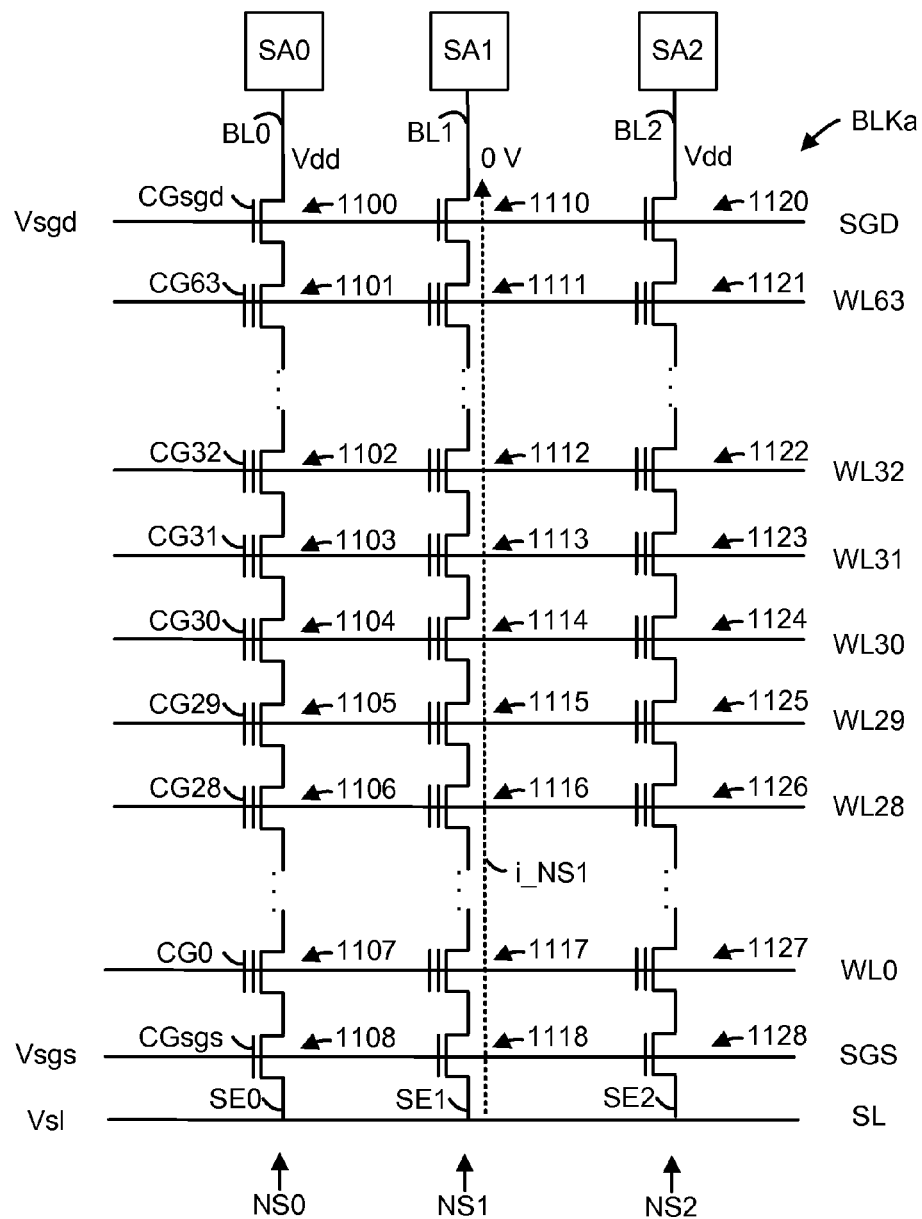

OPTIMIZED ERASE OPERATION FOR NON-VOLATILE MEMORY WITH PARTIALLY PROGRAMMED BLOCK

BACKGROUND OF THE INVENTION

1. Field of the Invention

The present invention relates to technology for non-volatile memory.

2. Description of the Related Art

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. When erasing a flash memory device, typically an erase voltage is applied to the substrate.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device. On the other hand, a multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

However, due to marketplace demands, techniques are needed to improve the operation of non-volatile memory devices.

BRIEF DESCRIPTION OF THE DRAWINGS

FIG. 7B depicts an example of a partially programmed block BLKa with a programmed source side adjacent sub-block SBLK0a and an erased non-source side adjacent sub-block SBLK1a.

FIG. 8B depicts an example of a first option for determining whether a block is partially programmed in accordance with step 802 of FIG. 8A.

FIG. 11C depicts current flow in NAND strings during a sensing process of odd-numbered bit lines in connection with an erase operation.

DETAILED DESCRIPTION

Technology is described herein for improving the accuracy of an erase operation of a non-volatile memory device such as a NAND memory device.

Figure 7A:
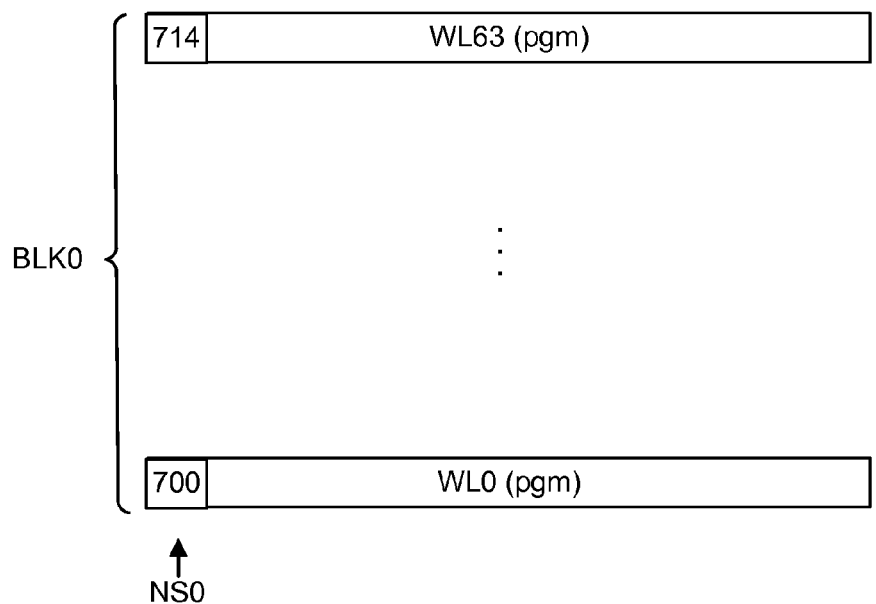
FIG. 7A depicts an example of a fully programmed block BLK0.
Figure 7B:
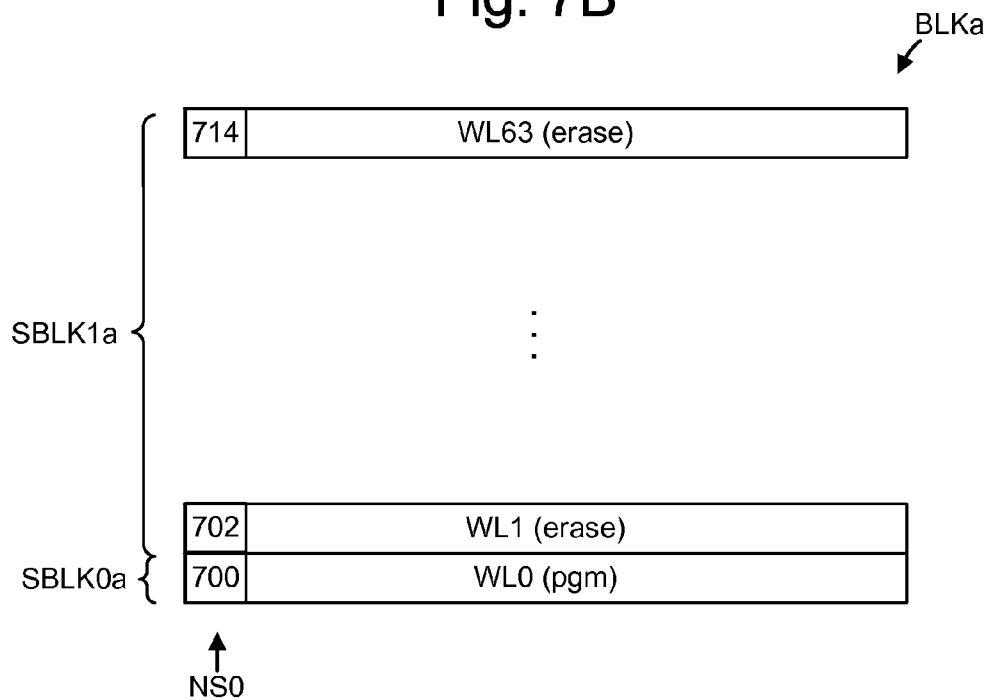
Figure 7C:
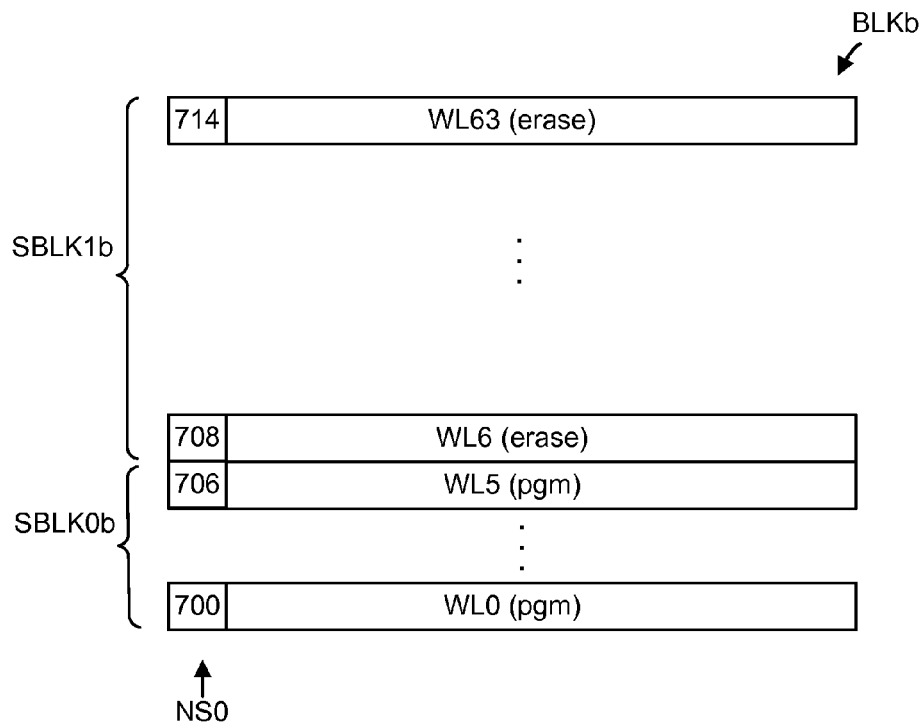
FIG. 7C depicts another example of a partially programmed block BLKb with a programmed source side adjacent sub-block SBLK0b and an erased non-source side adjacent sub-block SBLK1b.
Figure 7D:
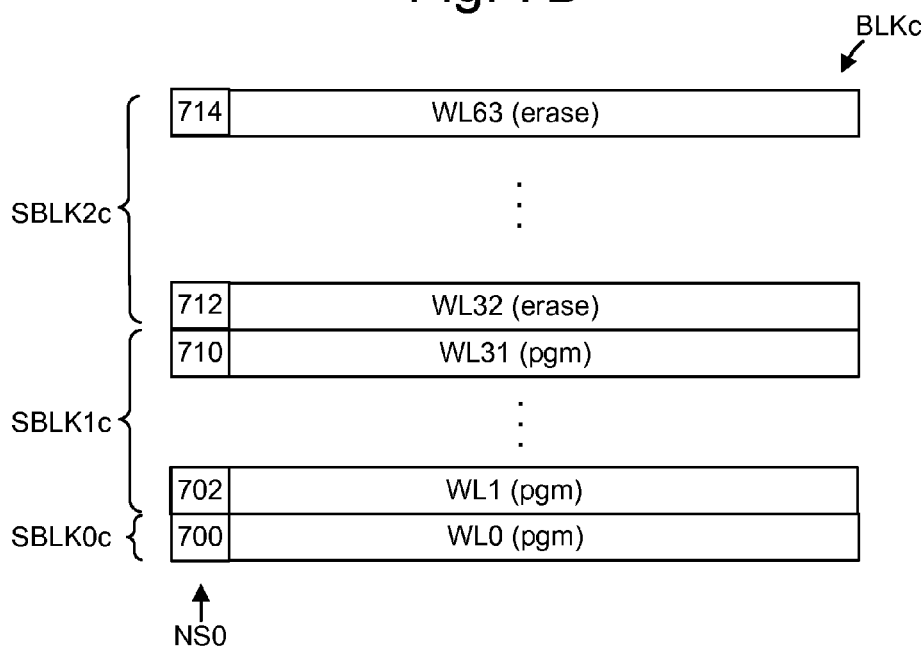
FIG. 7D depicts another example of a partially programmed block BLKc with a programmed source side adjacent sub-block SBLK0c, a programmed non-source side adjacent sub-block SBLK1c, and an erased non-source side adjacent sub-block SBLK2c.

In a NAND memory, data is programmed into storage elements in various blocks over the memory die. Each block comprises multiple word line (WLs) (for instance, 64 WLs). An erase operation is done at the block level, while a program operation is done at the word line level. Thus, after an erase operation, all the word lines within a block are fully erased. Subsequently, during a program operation, the word lines are programmed in a sequential order, e.g., starting from the first WL on the source side (WL0) of a NAND string and continuing up to the last WL (e.g., WL63) on the drain side of the NAND string. FIG. 7A provides an example of a fully programmed block. However, in some case, a small amount of user-data (such as ~8 KB) is to be programmed. This amount of data is not sufficient to fill up the block completely. In one scenario, only one WL (WL0) is programmed with the data, while the rest of the WLs (e.g., WL1-WL63) are kept erased from the last time the block was erased. In other scenarios, the block is programmed up to some other WL, which is not the last WL in the block. FIGS. 7B-7D provide examples of partially programmed blocks. A block that has not yet been completely filled with data on all the WLs is referred to as a partially programmed block. A partially programmed block is programmed in part but not fully.

In some cases, after partially programming a block, a controller will assign additional user data to be programmed in the remainder of the word lines (e.g., WL1-WL63) within a block, so that the block becomes fully programmed. However, in other cases, the controller may decide to erase a partially programmed block. Also, in some cases, certain blocks are assigned to store only system information data (non-user data). Since the system information data may not be sufficient to fill the entire block, these blocks are often kept in a partially programmed state, and if they need to be erased, they are erased in that state as well. Thus, an erase operation can be performed on a fully or partially programmed block. In both cases, the memory cells are typically erased and verified in the same way.

However, the characteristics of a block during erase-verify can greatly differ according to whether the block is fully or partially programmed. During an erase operation, a series of erase pulses are applied, where each erase pulse is typically followed by a verify pulse which is part of an erase-verify test. If the erase-verify test is passed, the erase operation successfully ends. If the erase-verify test fails, then the erase voltage (Verase) is stepped up by a step size (ΔVerase) such as ~0.5 V and the process is repeated until the erase-verify test is passed or until a maximum allowable number of erase loops are performed.

When partially programmed blocks are erased, since many of the WLs on the block are already erased, during the erase-verify test, the resistance of the NAND string appears to be lower than when the block is fully programmed. This makes the erase-verify test easier to pass for a partially programmed block, leading to a shallower erase depth (e.g., a higher Vth) at which the erase-verify test is passed. For example, if the erase-verify test is passed after five erase pulses for a fully programmed block, it may pass with only three erase pulses for a partially programmed block, resulting in a shallower erase-state depth for the partially programmed block, under the same erase-verify sensing parameters (e.g., sensing time, trip voltage or current, Vsl, Vbl and erase-verify voltage Vv_erase). This discrepancy in erase depth creates problems in setting the optimum erase-verify sensing parameters, and can potentially lead to a higher error bit count when the subsequent program operation is done after erasing a partially programmed block.

Techniques provided herein include performing a read operation before erase to determine the state of the block, e.g., the degree to which the block is programmed. Various compensation techniques can be used when erasing a partially programmed block, in order to account for the difference in behavior of a partially programmed block at the erase-verify test. In one approach, the erase-verify sensing parameters are dynamically adjusted, such that substantially the same erase depth is achieved regardless of whether a block is partially programmed to different degrees or fully programmed. In another approach, a partially programmed block is erased until the erase-verify test is passed after which an extra erase pulse is applied but is not followed by an associated erase-verify test. In another approach, a partially programmed block is fully programmed before erase.

Figure 1A:
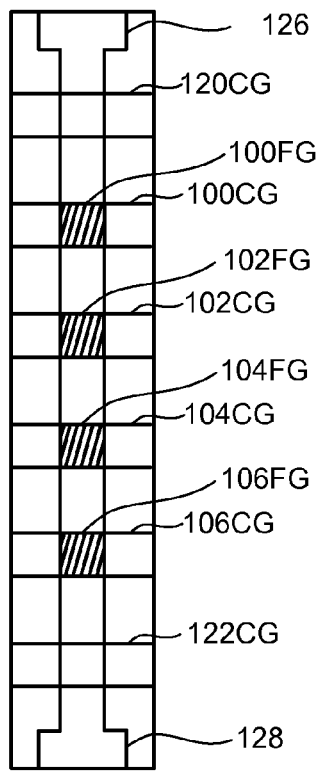
FIG. 1A is a top view of a NAND string.
Figure 1B:
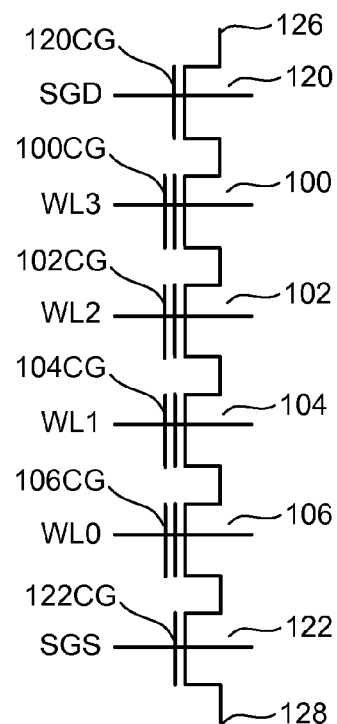
FIG. 1B is an equivalent circuit diagram of the NAND string of FIG. 1A.

One example of a memory system suitable for implementing the present technology uses the NAND flash memory structure, which arranges multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
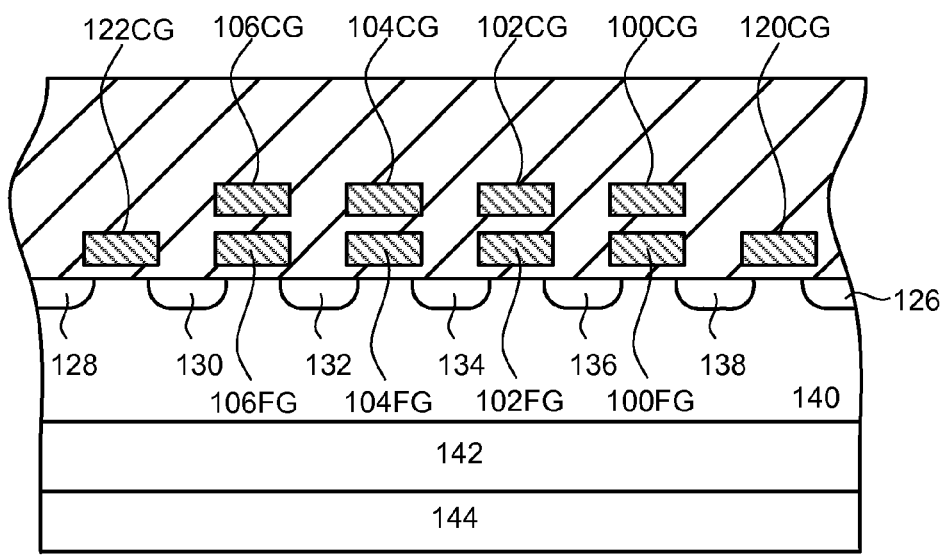
FIG. 2 is a cross-sectional view of the NAND string of FIG. 1A.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
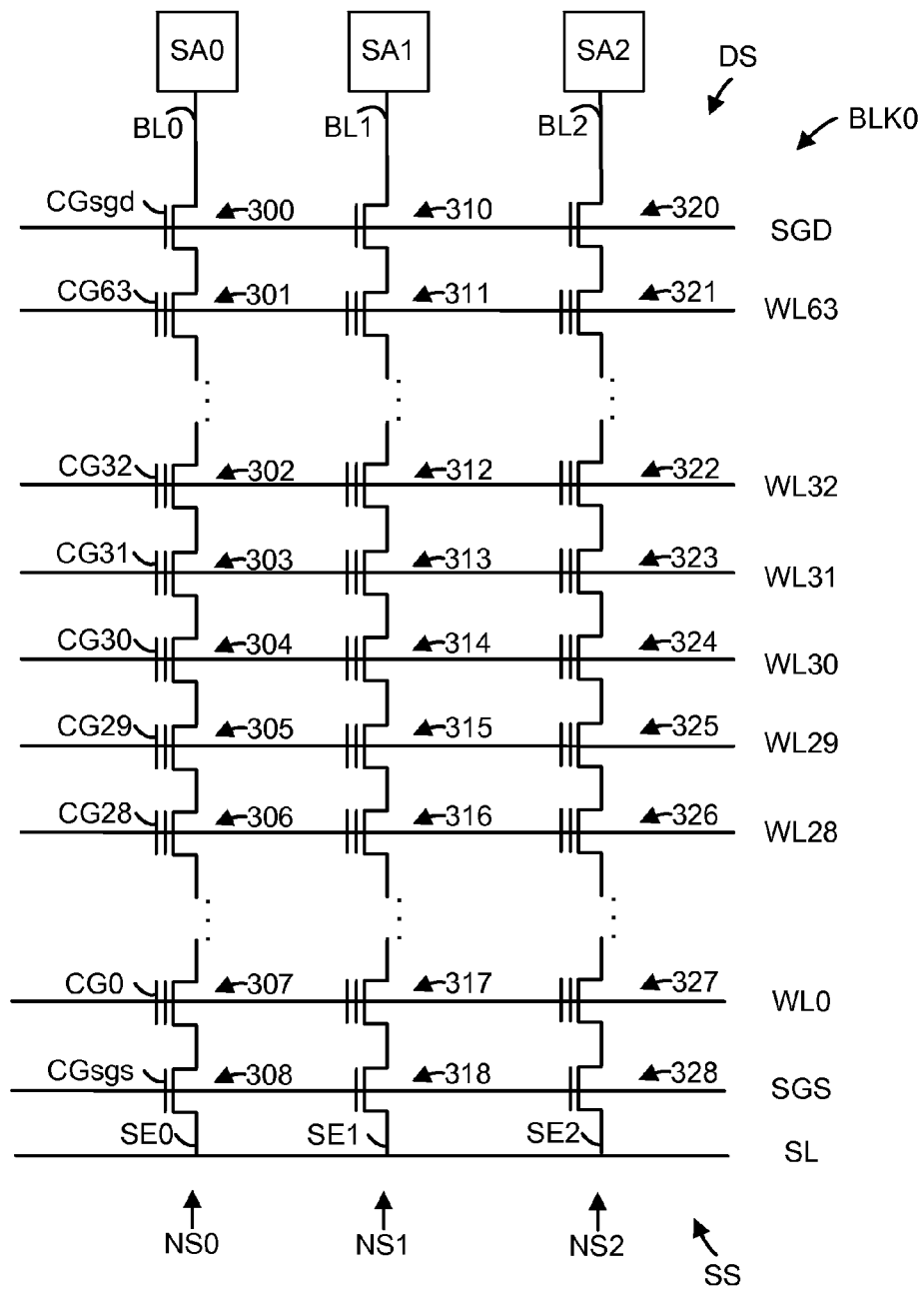
FIG. 3 depicts three example NAND strings such as shown in FIGS. 1A-2 in a block BLK0.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes storage elements 311, . . . , 312-316, . . . , 317, an SGS transistor 318 and a SGD transistor 310. Another example NAND string NS2 includes storage elements 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The storage elements can store user data and/or non-user data.

Figure 4:
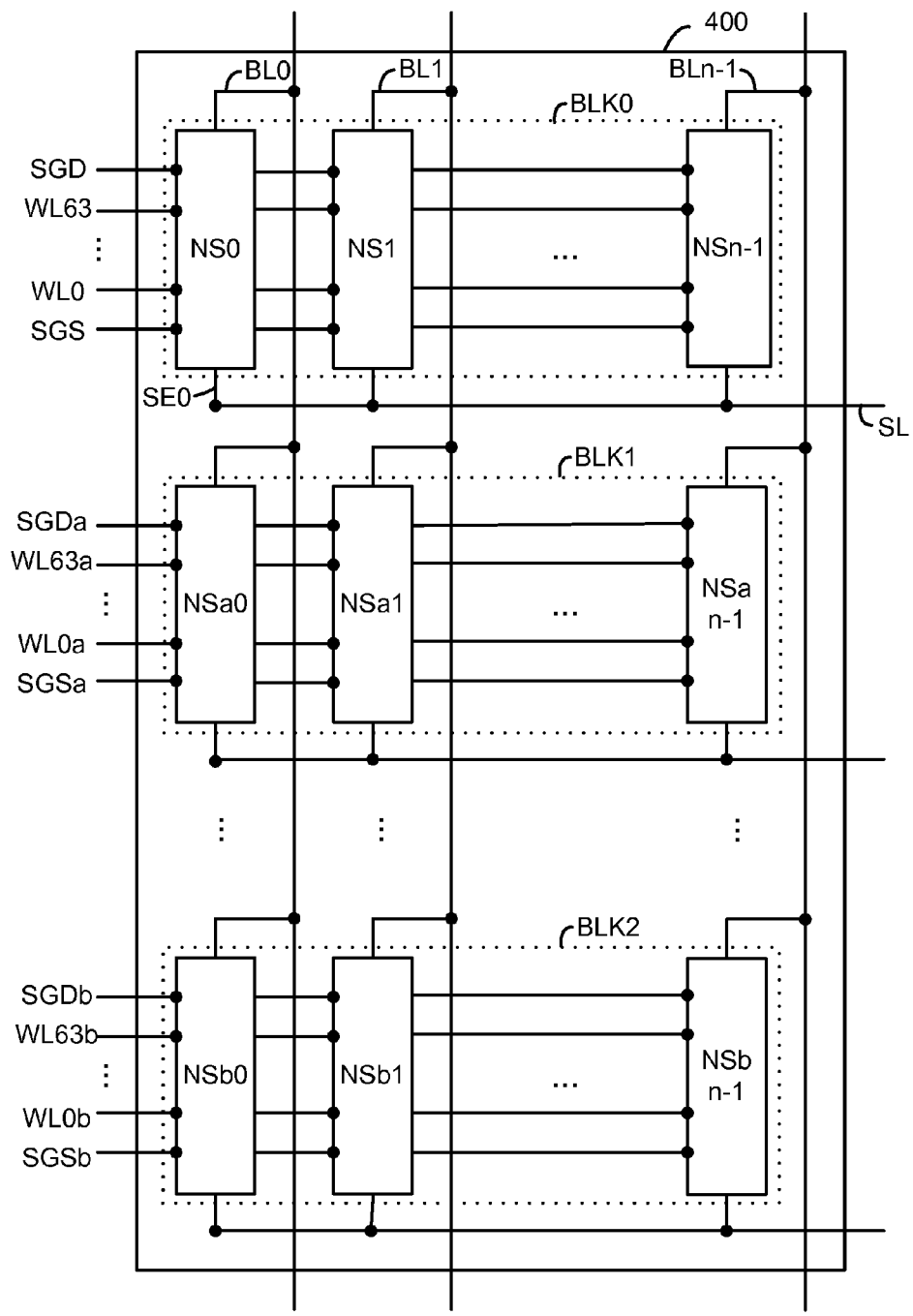
FIG. 4 is a block diagram of an array 400 of NAND flash memory cells including BLK0 of FIG. 3 and additional blocks BLK1 and BLK2.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, ..., NSn–1 in communication with BL0, BL1, ... BLn–1, respectively, and with WL0-WL63 SGS and SGD. BLK1 includes NAND strings NSa0, NSa1, ..., NSan–1 in communication with BL0, BL1, ... BLn–1, respectively, and with WL0a-WL63a, SGSa and SGDa. BLK2 includes NAND strings NSb0, NSb1, ..., NSbn–1 in communication with BL0, BL1, ... BLn–1, respectively, and with WL0b-WL63b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
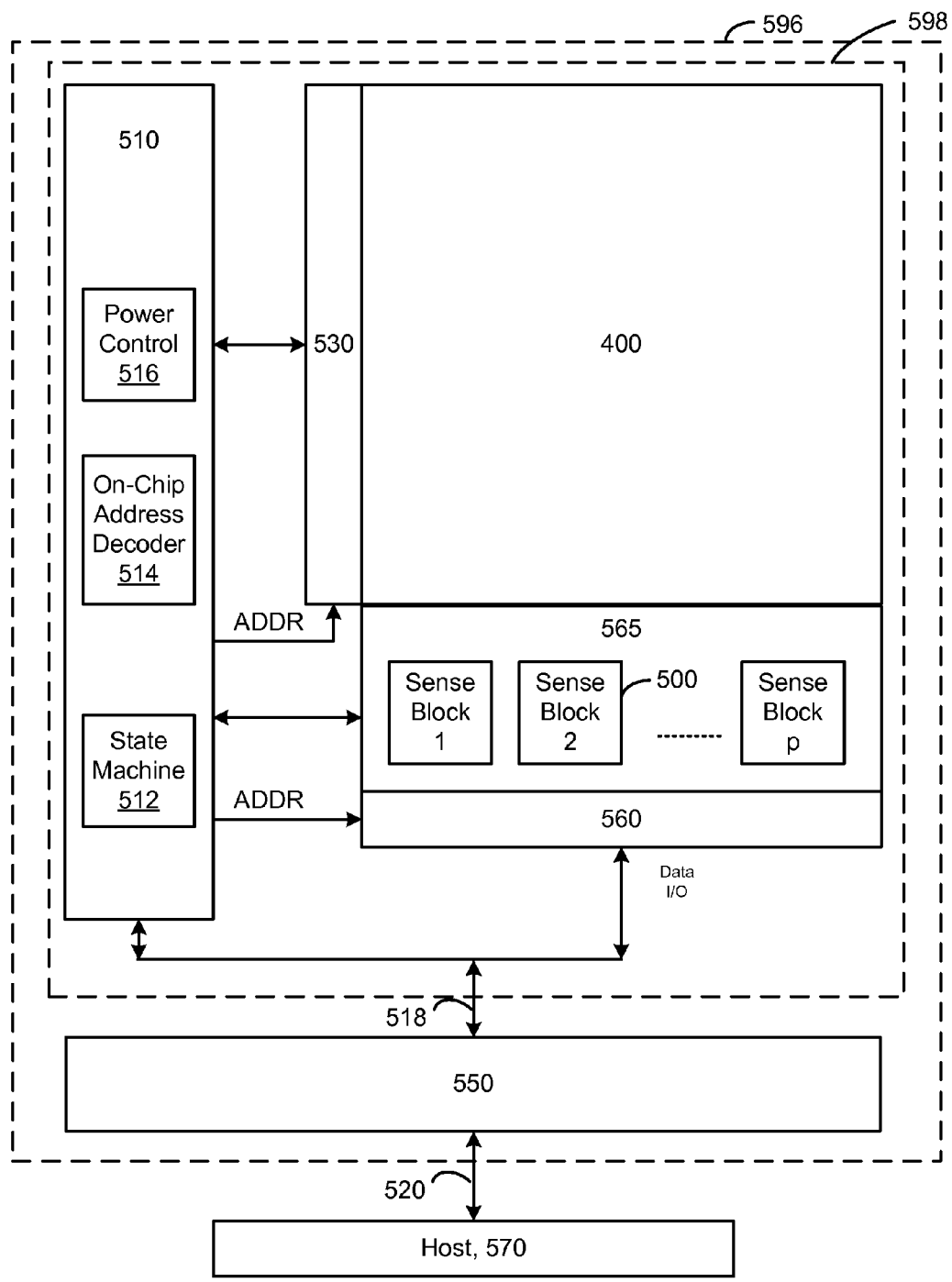
FIG. 5 is a block diagram of a non-volatile memory system which includes the array 400 of FIG. 4.

FIG. 5 is a block diagram of a non-volatile memory system which includes the array 400 of FIG. 4. The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance.

Figure 6A:
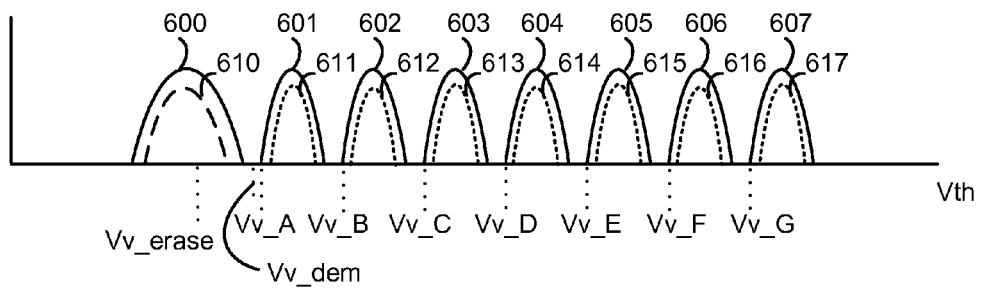
FIG. 6A depicts a threshold voltage (Vth) distribution for a fully programmed block with eight data states.
Figure 6B:
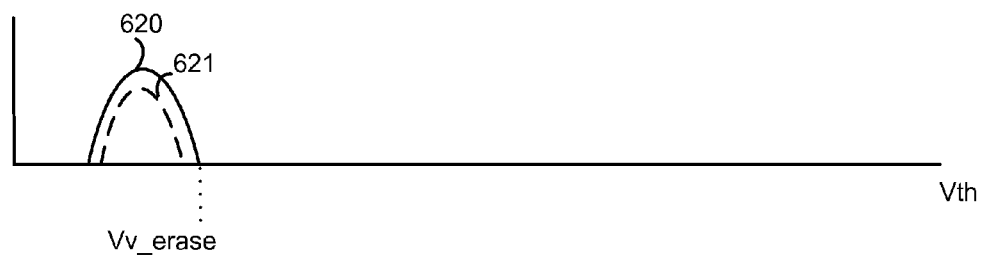
FIG. 6B depicts a Vth distribution which follows FIG. 6A after an erase operation.
Figure 6C:
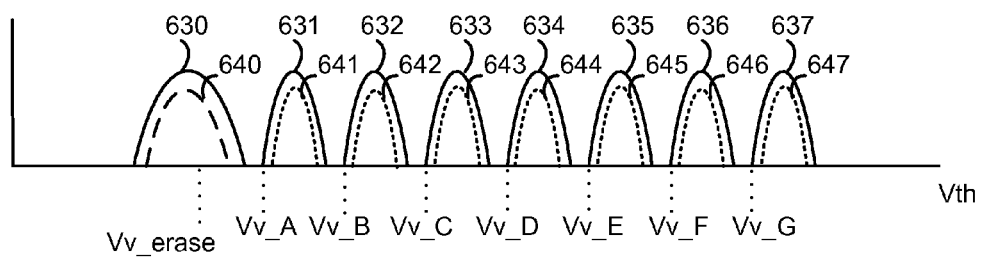
FIG. 6C depicts a Vth distribution which follows FIG. 6B after a programming operation.

FIG. 6A depicts a threshold voltage (Vth) distribution for a fully programmed block with eight data states. The eight data states include an erase state and seven programmed states referred to as states A-G, and data is randomly programmed among the states. Eight data states are used in one example. Under a Gray code, the states can be assigned values of 111 through 000 for the erased through G states. The verify voltages for the states are Vv_erase, Vv_A, Vv_B, Vv_C, Vv_D, Vv_E, Vv_F and Vv_G. In an erase operation, the Vth of the storage elements is lowered until a sufficient number (typically a large majority) of the storage elements have a Vth below Vv_erase (FIG. 6B). A subsequent programming operation can be performed either immediately after the erase or some time later, as needed, where some of the storage elements are programmed to the programmed states A-G while other storage elements remain in the erase state (FIG. 6C). The Vth distributions are shown separately for WL0 (Vth distributions 610-617) and the remaining word lines (e.g., WL1-WL63) (Vth distributions 600-607).

An additional voltage, Vv_dem ("dem" denotes "demarcation"), is a read voltage which can be used to distinguish between the erased state and the programmed states, such as discussed below in connection with step 822 of FIG. 8B. Vv_dem can be lower than Vv_A but higher than the erase distribution.

FIG. 6B depicts a Vth distribution which follows FIG. 6A after an erase operation. The Vth distributions are shown separately for WL0 (Vth distribution 621) and the remaining word lines (Vth distributions 620). The Vth of the storage elements is lowered until a sufficient number of the storage elements have a Vth below Vv_erase. Since the entire block was programmed before being erased, the storage elements on the different word lines are uniformly erased to a substantially equal Vth depth.

FIG. 6C depicts a Vth distribution which follows FIG. 6B after a programming operation. In this example, the same distribution as in FIG. 6A is achieved, which is desirable result. The distributions 630-637 are the same as the distributions 600-607, respectively, and the distributions 640-647 are the same as the distributions 610-617, respectively. Although the erase state storage elements are not intentionally programmed, they can be inadvertently programmed due to program disturb. In this case, the erase distributions 630 and 640 are higher than the corresponding distributions 620 and 621, respectively, due to program disturb and capacitive cross coupling effects from programming of the other neighboring storage elements to the A-G target data states. However, the Vth distribution (621, 640) of the WL0 storage elements is roughly centered within the Vth distribution (620, 630) of the WL1-WL63 storage elements both before (FIG. 6B) and after (FIG. 6C) the program disturb.

Optionally, the erase operation includes soft programming after the erase, where the Vth distribution is tightened. However, the Vth of the erased state storage elements can still be inadvertently raised due to program disturb and capacitive cross coupling effects from programming of neighboring storage elements.

Figure 6D:
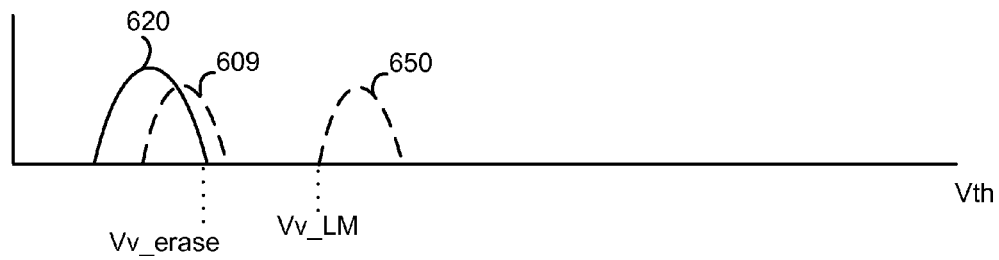
FIG. 6D depicts a Vth distribution for a partially programmed block with two data states.

FIG. 6D depicts a Vth distribution for a partially programmed block with two data states. In this example, WL0 is the only programmed word line, and the storage elements are either in the erased state (Vth distribution 609) or one programmed state (an LM state with Vth distribution 650) which has a verify level Vv_LM (LM denotes lower-middle). Thus, binary data is stored, as an example. The Vth distribution 620 for the WL1-WL63 storage elements is also shown. The Vth distribution 609 is a little lower than the distribution 610 of FIG. 6A since the erased state is shifted up less from the erased distribution 621 of FIG. 6B when only the LM state is programmed than when all programmed states are programmed as in FIG. 6A, due to program disturb and capacitive cross coupling effects.

Figure 6E:
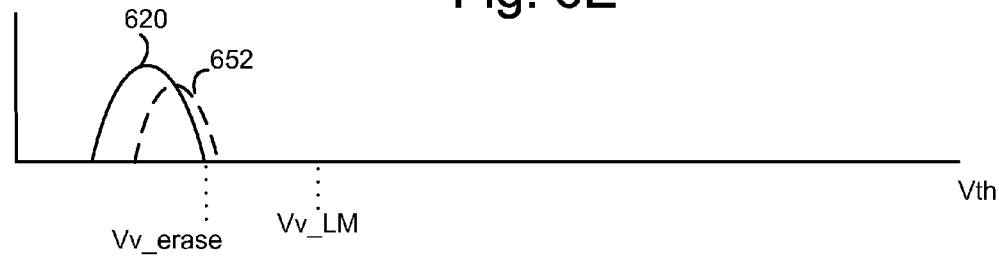
FIG. 6E depicts a Vth distribution which follows FIG. 6D after an erase operation.

FIG. 6E depicts a Vth distribution which follows FIG. 6D after an erase operation. The erase operation involves erasing the WL0 storage elements from Vth distributions 609 and 650 to Vth distribution 652. The WL1-WL63 storage elements remain erased as depicted by the Vth distribution 620. Thus, in addition to erasing the LM state storage elements (Vth distribution 650), the erased state storage elements are also subject to erase because the erased state storage elements are in an elevated Vth state (Vth distribution 609) due to program disturb and capacitive cross coupling effects from programming of neighboring storage elements, such that a portion of the Vth distribution 609 of the erased state storage elements is above Vv-erase. However, after the erase operation successfully passes, the WL0 storage elements are not as deeply erased from a state in which the block is partially programmed compared to a state in which the block is fully programmed, so that distribution 652 is higher than distribution 621 (FIG. 6B).

Figure 6F:
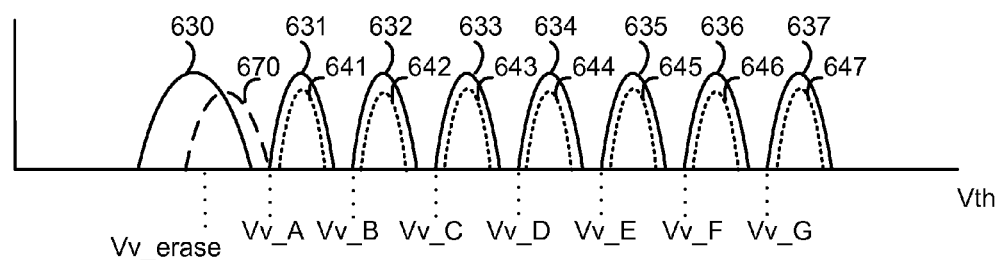
FIG. 6F depicts a Vth distribution which follows FIG. 6E after a programming operation.

FIG. 6F depicts a Vth distribution which follows FIG. 6E after a reprogramming operation. After the programming, the erase state distribution for WL1-WL63 (distribution 630, repeated from FIG. 6C) and the erase state distribution for WL0 (distribution 670) are raised due to program disturb and capacitive cross coupling effects from programming of neighboring storage elements. However, since the WL0 storage elements were not as deeply erased when the block is partially programmed as when the block is fully programmed, the erase state distribution for WL0 after program disturb and capacitive cross coupling effects, is higher when the block is partially programmed as when the block is fully programmed (distribution 670 is higher than distribution 640). This can lead to higher error rates on WL0 on a subsequent read operation.

Figure 6G:
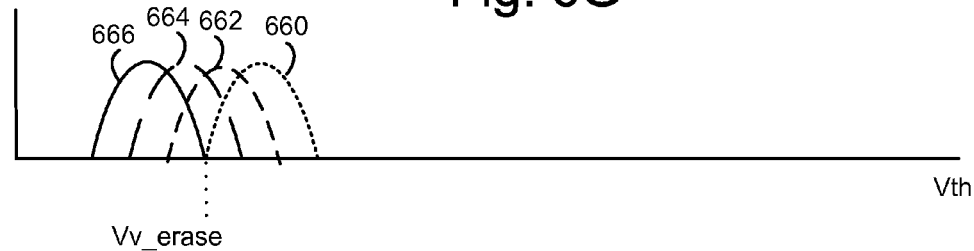
FIG. 6G depicts a Vth distribution which shows a change in Vth with successive erase pulses.

FIG. 6G depicts a Vth distribution which shows a change in Vth with successive erase pulses. In one approach, assume all word lines are erased together in a fully programmed block. In this case, distributions 660, 662, 664 and 666 are reached after an erase pulse #1, an erase pulse #2, an erase pulse #3 and an erase pulse #4, respectively. The distribution 656 is below Vv_erase so that the erased operation is completed. All WLs are erased together, and their respective threshold voltages shift down together at each erase pulse. The erase-verify test is passed after the fourth erase pulse, and all WLs have a similar erase depth.

In another approach, assume that distribution 666 represents WL1-WL63 in an erased state and that only WL0 is being erased from a programmed state. This case represents the partially programmed block erase case, where only WL0 was programmed before erase. In this case, distributions 660, 662 and 664 might be reached for WL0 after an erase pulse #1, an erase pulse #2 and an erase pulse #3, respectively. Since the block passes the erase-verify test sooner in the erase process, the storage elements of WL0 are erased to a shallower depth such as depicted by distribution 664 which could be the final distribution for WL0. Due to lower NAND string resistance, the erase-verify test is passed after the third erase pulse, and WL0 has a shallower erase depth than WL1-WL63.

Generally, when a fully programmed block is erased, all the WLs are erased from an initial programmed state. Thus, during any given erase-verify test, the storage elements of all the WLs will be at a similar Vth and hence contribute almost equally to the overall NAND string resistance. On the other hand, for a partially programmed block that only has data programmed only up to certain WL (e.g., WL0), before the erase is completed, the storage elements of all higher WLs (e.g., WL1-WL63) are already in the erased state and thus will have little contribution to the overall NAND string resistance. Thus, the overall NAND string resistance will be lower for a partially programmed block than for a fully programmed block, which makes the erase-verify test easier to pass. This causes the erase-verify test to be passed at a lower Verase for the partially programmed block, resulting in a shallower erase depth on the WL that was in a programmed state for the partially programmed block (e.g., WL0).

FIG. 7A depicts an example of a fully programmed block BLK0. In this example, the block BLK0 (corresponding to FIGS. 3 and 4) has 64 word lines (WL0-WL63) and they are each programmed. A programmed word line can be defined as, e.g., a word line for which at least a specified number of storage elements are in a programmed state. An example NAND string NS0 includes one storage element for each word line, including storage elements 700, . . . , 714 in WL0, . . . , WL63, respectively.

FIG. 7B depicts an example of a partially programmed block BLKa with a programmed source side adjacent sub-block SBLK0a and an erased non-source side adjacent sub-block SBLK1a. A sub-block can be a proper subset of a block. A sub-block can thus comprise a subset of a plurality of word lines of a block. In one approach, a sub-block includes contiguous (adjacent) word lines. In another approach, a sub-block includes non-contiguous (non-adjacent) word lines. For example, the sub-block can include odd-numbered but not even-numbered word lines, or even-numbered but not odd numbered word lines. A source side adjacent sub-block can be a sub-block which is adjacent to the source side SS (FIG. 3) of a block, e.g., the sub-block can extend from WL0 to a word line which is between the source side and the drain side (DS, FIG. 3) of a block. Or, the source side adjacent sub-block can include only WL0, for instance, as depicted in FIG. 7B. In this example, a programmed sub-block SBLK0a includes WL0 as a programmed word line, and an erased sub-block SBLK1a includes WL1-WL63 as erased word lines. In general, the block that is partially programmed has some but not all of the word lines programmed.

Example storage elements 700, 702, . . . , 714 of NS0 are in WL0, WL1, . . . , WL63, respectively.

The non-source side adjacent subset SBLK1a comprises a non-volatile storage element 714 which is adjacent to the drain side of the block.

FIG. 7C depicts another example of a partially programmed block BLKb with a programmed source side adjacent sub-block SBLK0b and an erased non-source side adjacent sub-block SBLK1b. In this example, SBLK0b includes WL0-WL5 as programmed word lines, and SBLK1b includes WL6-WL63 as erased word lines.

Example storage elements 700, ..., 706, 708, ..., 714 of a NAND string are in WL0, ... WL5, WL6, ..., WL63, respectively.

FIG. 7D depicts another example of a partially programmed block BLKc with a programmed source side adjacent sub-block SBLK0c, a programmed non-source side adjacent sub-block SBLK1c, and an erased non-source side adjacent sub-block SBLK2c.

In this example, a first programmed sub-block (which is a source side adjacent sub-block) SBLK0c includes WL0 as a programmed word line, a second programmed sub-block (which is a not a source side adjacent sub-block) SBLK1c includes WL1-WL31 as programmed word lines, and an erased drain side adjacent sub-block (which is a not a source side adjacent sub-block) SBLK2c includes WL32-WL63 as erased word lines. SBLK1c is a non-source side adjacent sub-block and a non-drain side adjacent sub-block. SBLK1c is thus intermediate to a source side adjacent sub-block and a drain side adjacent sub-block. A drain side adjacent sub-block can be a sub-block which is adjacent to the drain side DS (FIG. 3) of a block, e.g., the sub-block can extend from WL63 to a word line which is between the source side and the drain side of a block, or the drain side adjacent sub-block can include only WL63 (or other drain side edge word line), for instance.

Example storage elements 700, 702 ..., 710, 712, ..., 714 of a NAND string are in WL0, WL1, ... WL31, WL32, ..., WL63, respectively.

Figure 8A:
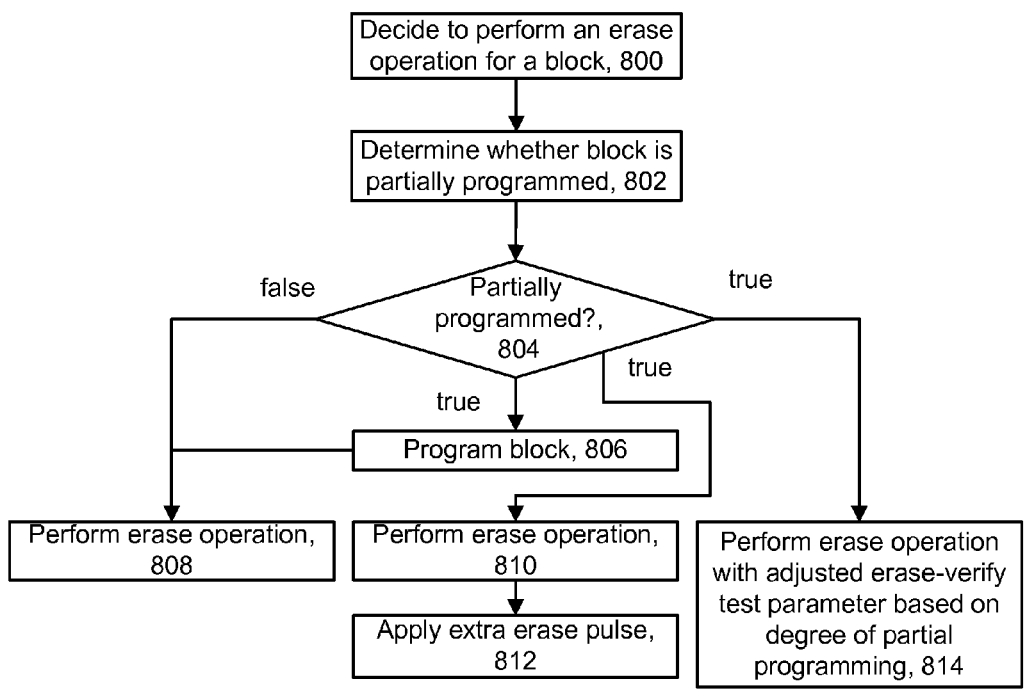
FIG. 8A depicts an example process for erasing a block.

FIG. 8A depicts an example process for erasing a block. The steps include: Decide to perform an erase operation for a block, 800; Determine whether block is partially programmed, 802; Partially programmed?, 804; Program block, 806 (e.g., programming multiple non-volatile storage element in a block); Perform erase operation, 808; Perform erase operation, 810; Apply extra erase pulse, 812; and Perform erase operation with adjusted erase-verify test parameter based on degree of partial programming, 814. Regarding step 800, a decision to perform an erase operation can be made by a host 570 or controller 550 (FIG. 5), for instance, by issuing an appropriate erase command. In connection with the erase operation, in response to the decision to perform the erase operation and the erase command, an additional action can be taken such as determining whether a block is partially programmed at step 802. When a decision is made to erase a block, the block is typically considered to be in a state other than fully erased. That is, the block is either partially or fully programmed. The host or controller may maintain status data which indicates whether or not a block is fully erased. In one approach, the host or controller does not maintain status data which indicates whether a block is partially or fully programmed. Instead, a determination is made as to whether a block is partially or fully programmed at step 802. Example implementations of this step are provided in FIGS. 8B and 8C.

Step 802 involves determining a degree of partial programming of a block, in connection with an erase operation, where the determining a degree of partial programming of the block comprises performing one or more read operations to identify a highest programmed word line among predetermined word lines of the plurality of word lines which are progressively further apart from one another, relative to the source side of the block.

One of four paths can be followed based on decision step 804. In a first path, if the block is not partially programmed at decision step 804, this means the block is fully programmed. In this case, the erase operation is performed at step. In a second path, if the block is partially programmed at decision step 804, the block is programmed at step 806. This can involve, e.g., programming the erased word lines while leaving the already-programmed word lines in their programmed state, or programming all word lines, including programming over the already programmed word lines. Another option is to program several predetermined word lines to raise the NAND string resistance by a sufficient amount before erase. For example, this can involve programming a fixed number of word lines regardless of the number of erased word lines. Or, this can involve programming an adaptive number of word lines which is a function of the number of erased word lines, such as a specified fraction (e.g., one-half) of the erased word lines. Remaining erased word lines can be left erased.

Furthermore, programming can be performed one word line at a time, or for multiple word lines concurrently, so that all word lines are raised to a programmed state. In one approach, all of the erased word lines are programmed concurrently. Note that the programming does not have to be accurate since the programmed states will not hold useful data. Instead, the programmed states change the NAND string resistance. In one approach, the programming does not involve verifying. Or, the programming can involve verifying at a level which is not associated with a particular programmed state.

The programming can use random programming of all data states, in one approach. The programming is in response to determining that the block is partially but not fully programmed at step 802, and involves performing programming for the block as a precursor to the erase operation at step 808. Programming the block before erasing it ensures that the storage elements in different word lines will be erased to a substantially uniform depth. In order to minimize the amount of programming, the program voltage used for this program step may be much lower than what is used normally for user-data program. Thus, the storage elements will be programmed to a lower Vth level, which may still be sufficient to raise the NAND string resistance adequately, such that it matches with that of a fully programmed block under the erase-verify test.

When programming the erased word lines while leaving the already-programmed word lines in their programmed state, the programming for the block can start at a first non-volatile storage element, in a programming order, of the non-source side adjacent subset of the string, and proceed, in the programming order, to a last non-volatile storage element of the string, which is adjacent to the drain side of the block. For example, in SBLK1a of FIG. 7B, the programming can start at the first non-volatile storage element 702 of SBLK1a and proceed to the non-volatile storage element 714. As another example, in SBLK1b of FIG. 7C, the programming can start at the first non-volatile storage element 708 of SBLK1b and proceed to non-volatile storage element 714. As another example, in SBLK1c of FIG. 7D, the programming can start at the first non-volatile storage element 702 of SBLK1c and proceed to the non-volatile storage element 714. Or, the programming of the erased word lines can be concurrent. For example, WL1-WL63 in FIG. 7B, WL6-WL63 in FIG. 7C, and WL32-WL63 in FIG. 7D, can be programmed concurrently. Programming for a block can comprise programming multiple non-volatile storage elements of a NAND string concurrently.

In a third path, if the block is partially programmed at decision step 804, the block is erased at step 810 (similar to step 808) after which the block is subject to additional erasing such as an extra erase pulse. The extra erase pulse ensures that the storage elements are erased to a sufficient depth. Moreover, the programming of the block in step 806 which may degrade endurance can be avoided. One or more extra erase pulses may be used. The one or more extra erase pulses are not followed by a verify operation. See also FIG. 9B. The erase voltage used for the one or more extra pulses can be optimized such that the final erase depth achieved by this method can match that of a fully-programmed block erase case. The erase voltage used for one or more extra pulses can also be based on the degree of partial programming of the block prior to erase. In general, the fewer the WLs programmed in the block, the higher the erase voltage required for the one or more extra erase pulses. A lower degree of partial programming occurs when a block is programmed to one or a few WLs. A higher degree of partial programming occurs when a block is programmed to many or all WLs.

In a fourth path, if the block is partially programmed at decision step 804, the block is erased at step 814 using an adjusted erase-verify test parameter. See FIGS. 13A-14C. By adjusting the erase-verify test parameter based on the degree of partial programming of the block prior to erase, the final erase depth achieved by this method can be made independent of the degree of partial programming of the block.

FIG. 8B depicts an example of a first option for determining whether a block is partially programmed in accordance with step 802 of FIG. 8A. This approach determines whether there are programmed storage elements in one or more non-source side adjacent subsets of a string. In this case, the one or more storage elements of a source side adjacent subset of the string are made to be in a conductive state so that the conductive state of the string is based on the one or more non-source side adjacent subsets of a string. This allows us to determine whether the block is partially programmed beyond the source side adjacent subset. The steps include: Begin sensing operation for NAND strings, 820; Apply Vread to storage elements in a source side adjacent subset of the string; apply Vv_dem to storage elements in a non-source side adjacent subset of the string, 822; Sense current in the NAND strings, 824; Strings are in a conductive state?, 826; Non-source side adjacent subset of the string is erased, 828; Decide to repeat sensing for another non-source side adjacent subset of the string, 830; Non-source side adjacent subset of the string is programmed, 832; and End, 834.

In step 822, Vread is a read control gate voltage which is applied to one or more word line. Vread is sufficiently high (e.g., 6-8 V) to render the storage elements in communication with the word lines to which Vread is applied in a strongly conductive or on state, so that they have essentially no resistance in a NAND string. Vread can be applied concurrently to all word lines in the source side adjacent subset of a string. Vv_dem is a demarcation control gate voltage such as described in FIG. 6A. Vv_dem can be applied concurrently to all word lines in the one or more non-source side adjacent subsets of a string. Vv_dem demarcates between an erased state and a programmed state, and can be used to distinguish storage elements which are in the erased state from storage elements which are in the lowest programmed state or higher programmed states.

In step 824, considering each NAND string individually, if one or more storage elements of the non-source side adjacent subset are in a programmed state, the sensing will determine that the non-source side adjacent subset is non-conductive. That is, the non-source side adjacent subset is programmed, so that step 832 is reached after decision step 826, and the process ends at step 834. If the sensing determines that the non-source side adjacent subset is conductive, it is concluded that the non-source side adjacent subset is erased, so that step 828 is reached after decision step 826.

Optionally, more than one non-source side adjacent subset is defined, and the sensing of step 824 is performed separately for each subset. For example, at step 830, the host or controller decides to repeat the sensing for another non-source side adjacent subset. This approach can determine the degree to which a block is partially programmed. For example, in FIG. 7D, we can first determine if SBLK2c is programmed, by applying Vv_dem on all word lines belonging to SBLK2c subset, and Vread on the rest of the word lines in the block. If SBLK2c is programmed, we can conclude that SBLK1c is also programmed due to a presumed source to drain word line programming order, and there is no need to sense SBLK1c. If SBLK2c is erased, we still do not know if SBLK1c is programmed, so we perform sensing on SBLK1c, by applying Vv_dem to all word lines belonging to SBLK2c and SCLK1c, and Vread on the rest of the word lines in the block. Similarly, the sensing order of multiple non-source side adjacent subsets can proceed one non-source side adjacent subset at a time, starting from the non-source side adjacent subset which is closest to the drain side of the block and proceeding toward the source side of the block.

If SBLK2c is programmed, in one approach, we do not know the highest programmed word line in SBLK2c, but we know that there is at least one programmed word line in SBLK2c which is the highest programmed word line in the block (BLKc). This is a sufficient granularity in many cases and avoids performing many sensing operations.

Similarly, if SBLK2c is not programmed, and SBLK1c is programmed, in one approach, we do not know the highest programmed word line in SBLK1c, but we know that there is at least one programmed word line in SBLK1c which is the highest programmed word line in the block (BLKc).

Figure 8C:
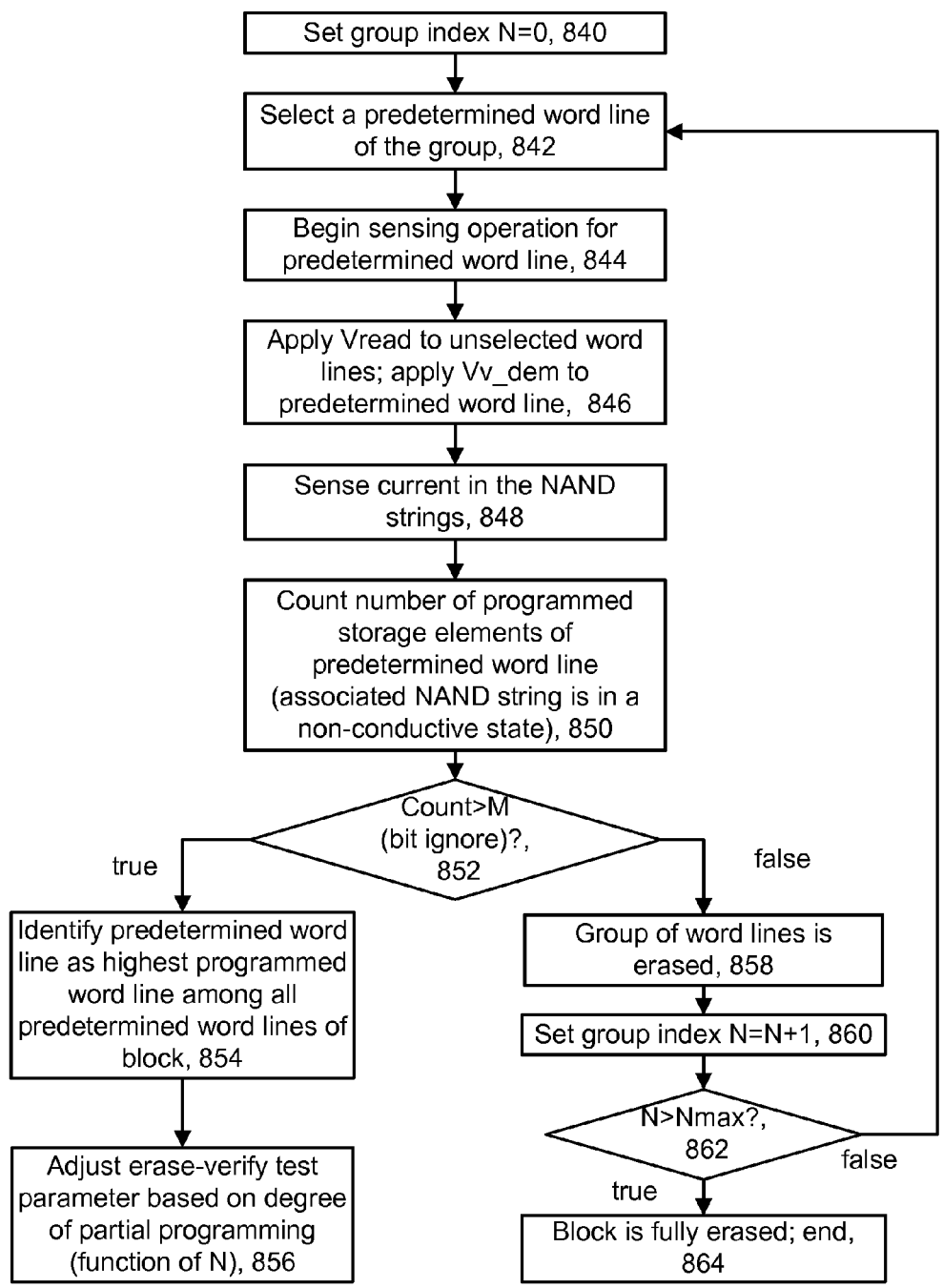
FIG. 8C depicts an example of a second option for determining whether a block is partially programmed in accordance with step 802 of FIG. 8A.

FIG. 8C depicts an example of a second option for determining whether a block is partially programmed in accordance with step 802 of FIG. 8A. In this approach, a highest programmed word line is determined from a plurality of predetermined word lines. "Highest" means closest to the drain side of block. A number of predetermined word lines are selected, and each predetermined word line represents a group of one or more word lines such as contiguous word lines. The groups and predetermined word lines can be defined such as described in connection with FIGS. 10A and 10B. In one approach, the predetermined word lines of the plurality of word lines of a block are progressively further apart from one another, relative to the source side of the block.

The steps include: Set group index N=0, 840; Select a predetermined word line of the group, 842; Begin sensing operation for predetermined word line, 844 (e.g., reading the predetermined word line); Apply Vread to unselected word lines; apply demarcation control gate voltage to predetermined word line, 846; Sense current in the NAND strings, 848; Count number of programmed storage elements of predetermined word line (associated NAND string is in a non-conductive state), 850; Count>M (bit ignore)?, 852; Identify predetermined word line as highest programmed word line among all predetermined word lines of block, 854; Adjust erase-verify test parameter based on degree of partial programming (function of N), 856; Group of word lines is erased,

858; Set group index N=N+1, 860; N>Nmax?, 862; and Block is fully erased; end, 864. M is a specified count of a number of storage elements.

Figure 10A:
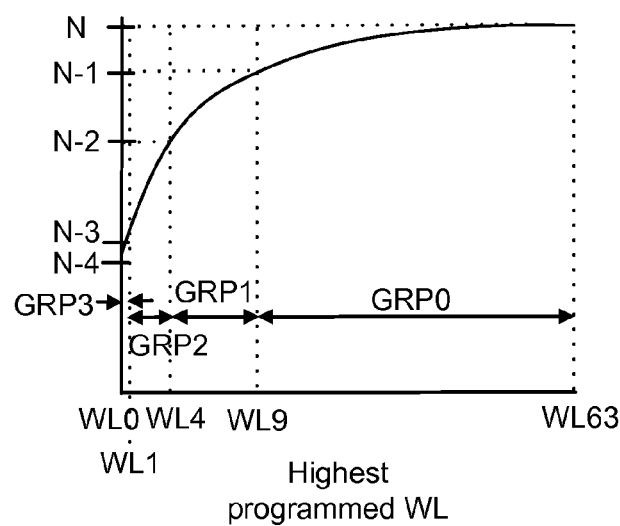
FIG. 10A depicts a relationship between a number of erase loops needed to complete an erase operation for a block and a highest programmed group for the block.

In step 840, the group index is an identifier of the group. For example, FIG. 10A provides groups GRP0-GRP3. The lowest index can be assigned to a drain side group, and the higher indexes can be assigned to the remaining groups, proceeding in a direction from the drain side of the block to the source side of the block. The groups of word lines (and their representative predetermined word lines) are provided according to determination of a number of erase loops which are needed to complete an erase operation (which is a function of the resistance in the NAND string) when the highest programmed word line of the block is in the group. An optimum definition of groups and predetermined word lines can be made based on measurements of the number of erase loops as a function of the highest programmed word line of a block. See FIG. 10A.

To sense a predetermined word line, Vv_dem is applied to the predetermined word line while all other word lines, in one approach, concurrently receive Vread to render them in a strongly conductive state. Regarding step 850, when each storage element along the predetermined word line is sensed, the storage element is classified as being in an erased state or a programmed state. At decision step 852, a bit ignore value M (a positive integer) can be defined as a threshold number. If the count of programmed storage elements in a predetermined word line exceeds the threshold, it is concluded that the predetermined word line is in a programmed state. The use of the bit ignore value avoids declaring a predetermined word line as being programmed in a situation in which a few storage elements inadvertently become programmed or are incorrectly read as being programmed.

At step 854, since we sense the predetermined word lines in an order starting from the drain side of a block, and since a source to drain programming order is assumed, the first predetermined word line which is determined to be programmed is the highest programmed predetermined word line in the block.

If decision step 852 is true, at step 856, an erase-verify test parameter is adjusted based on the highest programmed group or predetermined word line as represented by the current value of the index N. This is discussed further below.

If decision step 852 is false, at step 860, the group index is incremented and the next group or predetermined word line (one or more additional word lines) is sensed if the last (closest to the source side of a block) group or predetermined word line has not yet been reached. This is determined by the test of N>Nmax at decision step 862, where Nmax (a positive integer) is the index of the last group or predetermined word line of the block.

Thus, when the word line of the predetermined word lines which is closest to the drain side of the block does not have at least the specified count of programmed non-volatile storage elements, the process involves proceeding to read one or more additional word lines of the predetermined word lines, in an order moving progressively away from the drain side of the block, until a word line of the predetermined word lines which has at least the specified count of programmed non-volatile storage elements is identified.

This option performs a read operation on the block before the erase operation begins, to judge whether the block is a fully or partially programmed. For a partially programmed block, the read operation determines the approximate degree to which the block is programmed (e.g., how many WLs are programmed in the partially programmed block). After the determination is made about the state of the block, the erase-verify sensing parameters can be dynamically adjusted accordingly and the erase and verify operations are performed. Generally, if the block is partially programmed, the erase-verify sensing voltage such as a trip level of Vbl called Vtrip (if source-follower erase-verify sensing is used), or Vsl (if negative all bit line erase-verify sensing is used) is raised up higher above a default value, to make the erase-verify test harder to pass. By using optimized erase-verify sensing voltages, the same or similar erase depth can be achieved for the partially programmed block as with the fully programmed block. An advantage of this adaptive technique is that the erase-verify sensing parameters (sensing voltage) do not need to be fixed based on the limiting case of ensuring a sufficient erase depth for a partially programmed block. This limiting case can result in over-erase of a fully programmed block, potentially leading to worse write/erase endurance. Another advantage of erase-verify sensing parameter change is avoiding excessive power and over erase for all write/erase cycles. By setting erase-verify sensing parameters to an optimum value for both a partially programmed block and a fully programmed block, better write/erase endurance can be achieved, while avoiding a shallow erase on partially programmed blocks that can lead to higher error bits in the subsequent program operation.

Figure 8D:
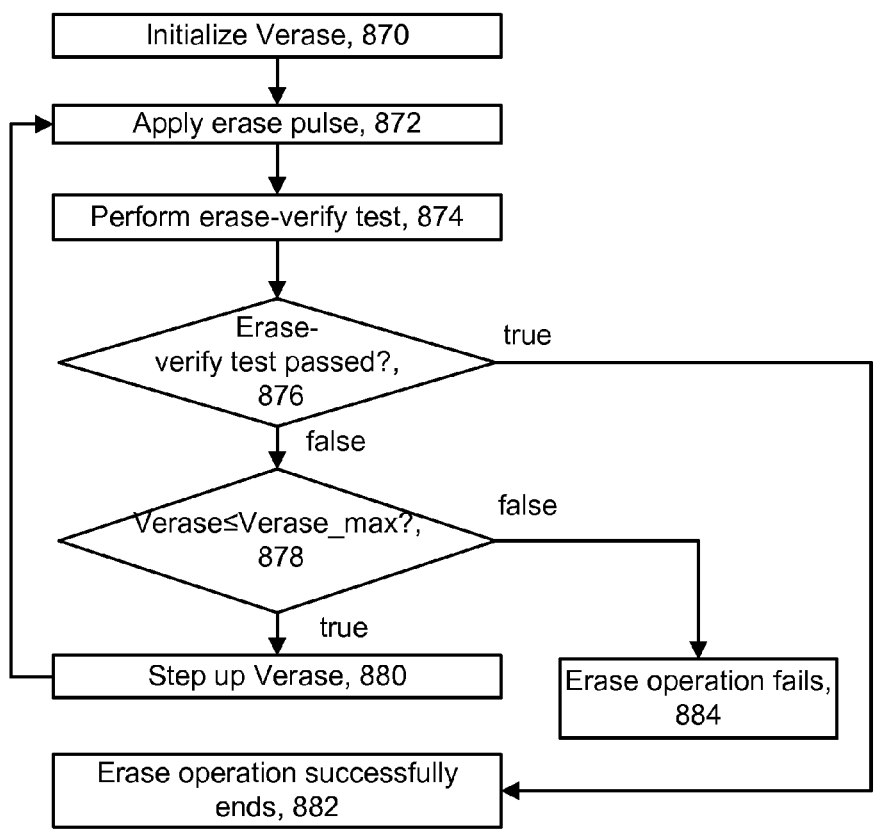
FIG. 8D depicts an example erase operation in accordance with step 808, 810 or 814 of FIG. 8A.

FIG. 8D depicts an example erase operation in accordance with step 808, 810 or 814 of FIG. 8A. The steps include: Initialize Verase, 870; Apply erase pulse, 872; Perform erase-verify test, 874; Erase-verify test passed?, 876; Verase≤Verase_max?, 878; Step up Verase, 880; Erase operation successfully ends, 882; and Erase operation fails, 884. In one approach, Verase is the level of a voltage which is applied to the substrate of a block to draw electrons out of the floating gate of a storage element to thereby lower the Vth of the storage element. Performing the erase-verify test can include concurrently applying a voltage Vv_erase to multiple word lines in a block. The erase-verify test can be performed concurrently for storage elements associated with all bit lines (such as in FIG. 11A), even-numbered bit lines (such as in FIG. 11B) or odd-numbered bit lines (such as in FIG. 11C).

At decision step 876, the erase-verify test is passed if the sensed storage elements have reached the erased state (e.g., their Vth is below Vv_erase so that the sensed storage elements and their respective NAND strings are in a conductive state).

If decision step 876 is true, the erase operation successfully ends (step 882). If decision step 876 is false, Verase is stepped up (see FIG. 9A) and an additional erase pulse is applied, if Verase has not yet reached a maximum level, Verase_max. If decision step 876 is false and Verase has exceeded the maximum level (e.g., decision step 878 is false), the erase operation fails at step 884.

Figure 9A:
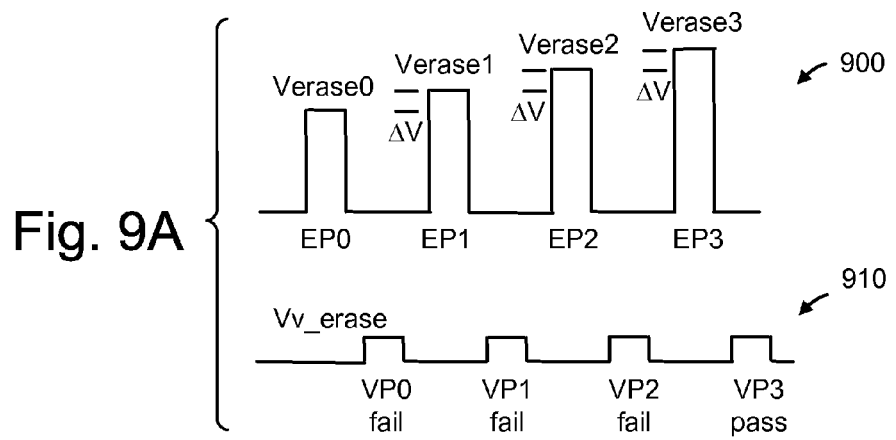
FIG. 9A depicts an example erase operation in which each erase pulse is followed by a verify pulse.

FIG. 9A depicts an example erase operation in which each erase pulse is followed by a verify pulse. An erase operation can be performed for a block of storage elements by applying one or more erase pulses, e.g., EP0-EP3 (waveform 900) to a substrate on which the block is formed. After the first erase pulse EP0, the peak amplitude of each erase pulse can be stepped up from the previous erase pulse by a step size ΔV. In one approach, after each erase pulse is applied to the substrate, a verify operation is performed as represented by waveform 910. Waveform 910 shows verify pulses or voltages VP0-VP3 of amplitude Vv_erase which are applied to one or more word lines of storage elements being erased. VP0-VP3 are verify pulses associated with, and following, EP0-EP3, respectively. In this example, it is assumed that the erase operation ends successfully (step 882 of FIG. 8D) after VP3. Thus, the erase-verify test associated with VP0-VP2 is failed, and the erase-verify test associated with VP3 is passed.

Figure 9B:
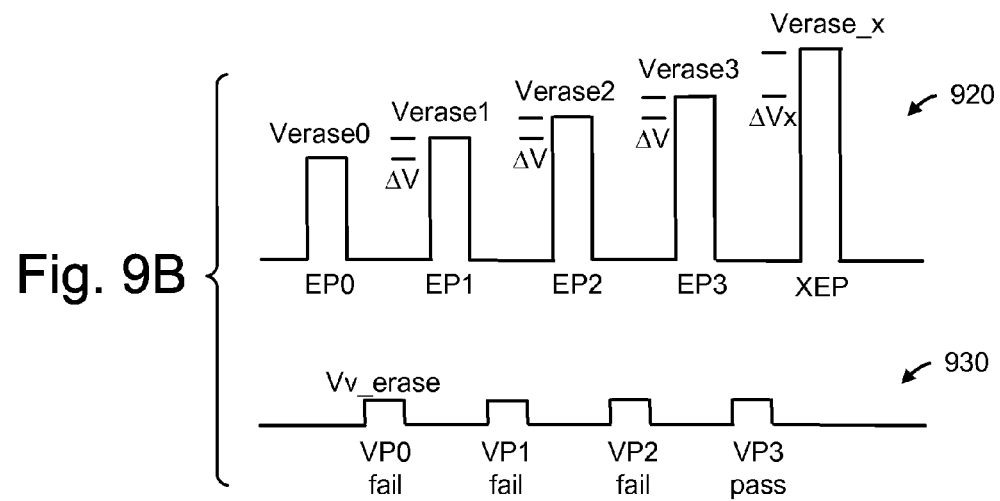
FIG. 9B depicts an example erase operation in which a last, extra erase pulse is not followed by a verify pulse.

FIG. 9B depicts an example erase operation in which a last, extra erase pulse (XEP) is not followed by a verify pulse. The erase operation is performed for a block of storage elements by applying erase pulses EP0-EP3 and XEP (waveform 920) to a substrate on which the block is formed. For EP1-EP3, the peak amplitude of each erase pulse can be stepped up from the previous erase pulse by a step size ΔV (ΔVerase). In this example, it is assumed that the erase-verify test associated with VP0-VP2 is failed, and the erase-verify test associated with VP3 is passed. Instead of ending the erase operation at this point, as in FIG. 9A, one or more extra or additional erase pulses (XEP) are applied to the substrate, where the one or more extra or additional erase pulses are not followed by an associated verify pulse. The peak amplitude of the one or more extra erase pulse XEP can be stepped up from the previous erase pulse EP3 by a step size ΔVx which is the same or different than ΔV. In one approach, ΔVx>ΔV. Waveform 930 shows verify pulses or voltages VP0-VP3 of amplitude Vv_erase which are applied to one or more word lines of storage elements being erased. VP0-VP3 are verify pulses associated with, and following, EP0-EP3, respectively. This approach has an advantage that the storage elements are erased to a sufficient depth, without changing the erase-verify test.

FIG. 10A depicts a relationship between a number of erase loops needed to complete an erase operation successfully (i.e., the erase-verify test successfully passes after the last erase pulse) for a block and a highest programmed group for the block. An erase loop involves an erase pulse in an erase iteration followed by a verify pulse in a verify iteration. The number of erase loops needed to complete an erase operation successfully increases when the highest programmed group (or predetermined word line which represents a group) is closer to the drain side of a block. On the x-axis, WL0-WL63 denote the highest programmed word line. The y-axis denotes the number of erase loops needed when the highest programmed word line is as indicted on the x-axis. The relationship is shown by a non-linear curve which increases relatively quickly at the lower word lines, then increases more slowly at the higher word lines. The range of word lines can be divided up roughly into multiple regions such as four regions, where each region is associated with a group of word lines. In one approach, WL9-WL63 are in GRP0, WL4-WL8 are in GRP1, WL1-WL3 are in GRP2 and WL0 is the sole word line in GRP3. Thus, the groups are progressively smaller when moving from the drain side of a block to the source side. The predetermined word lines in this example can be WL9, WL4, WL1 and WL0 in GRP3, GRP2, GRP1 and GRP0, respectively. See FIG. 10B, which shows a portion of FIG. 10A in greater detail. In this case, the predetermined word line of a group is the lowest (closest to the source side of the block) word line of the group. The predetermined word lines are progressively further part from one another when moving from the source side to the drain side of the block. For example, WL1 is adjacent to WL0, WL4 is three word lines away from WL1 and WL9 is five word lines away from WL4.

The number of erase loops is N−1, N−2, N−3 and N−4 for WL9, WL4, WL1 and WL0, respectively, representing, GRP3, GRP2, GRP1 and GRP0, respectively. N is a number of erased loops for a fully programmed block.

Thus, the predetermined word lines comprise an edge word line (e.g., WL0) which is adjacent to the source side of the block, a second-to-edge word line (e.g., WL1) which is adjacent to the edge word line and a third-to-edge word line (e.g., WL4) which is non-adjacent to the second-to-edge word line.

The groups of WLs can be based on a difference in erase loops (ΔEL) for a partially programmed block as compared to a fully programmed block. For example, GRP0 (0<ΔEL<1): WL9-WL63; GRP1 (1<ΔEL<2): WL4-WL8; GRP2 (2<ΔEL<3): WL1-WL3; and GRP3 (3<ΔEL<4): WL0.

In the proposed scheme, a different Vsl is used depending on how many WLs are programmed in the block before erase. We divide the block into multiple groups of WLs (four groups in the above example) depending on the difference in erase loops that is seen if the block is erased after being partially programmed up to that group of WL. For example, WL9-WL63 are in GRP0 because a block partially programmed up to WL9 and higher has ΔEL<1. Similarly GRP1, GRP2 and GRP3 are defined. A read operation is performed before erase to determine the highest programmed group in a block. Based on that determination, Vsl is changed to ensure that we obtain the same or similar erase depth regardless of the degree of partial programming of the block before the erase. For example, if block is determined to be programmed only up to GRP3, then Vsl is raised by 3*ΔVsl. If block is determined to be programmed only up to GRP2, then Vsl is raised by 2*ΔVsl. if block is determined to be programmed only up to GRP1, then Vsl is raised by ΔVsl. See FIG. 10F for further details. As an example, ΔVsl is about 0.1 V. Vsl is one example of a sensing parameter which can be adjusted.

Applying the process of FIG. 8C to the example group assignments of FIG. 10A, before the erase operation, a read is done on the first selected WL of GRP0 (WL9 in this example). During the read, 0V (or some other low bias) is applied on the selected WL, while the unselected WLs are at Vread. If a storage element is read as conductive (on), its designated as a '1' in the read data, while a non-conductive (off) storage element is a '0'. The number of '0's is counted and is compared to a value 'M' (e.g., about 10-20 bits per WL) which is a ROM fuse set value of bit ignore. If the count of 0's is found to be above M, it is concluded that the WL is programmed, and hence the block is judged to be programmed to at least the first (e.g., lowest) WL of GRP0. This means the default Vsl (Vsl_def) can be used to erase the block. However, if the count of 0's is found to be ≤M, the WL is judged to be not programmed (e.g., the WL is judged to be or erased). Then, the read operation is performed on the first WL of the next group of WLs (WL4 from GRP1 in this example), and Vsl (to be used in the subsequent erase-verify test) is raised by step size *ΔVsl. This process is continued until we find the group for which the first WL is programmed. Or, if the group# exceeds the maximum number of groups defined (4 in this example), the block is determined to be already erased.

A higher Vsl is thus used for a block which is partially programmed, and the amount by which the Vsl is raised is a function of the portion of the block that is programmed. The smaller the portion of the block that is programmed, the higher Vsl is raised. This process essentially eliminates the discrepancy in erase depth seen between partially and fully programmed blocks. The at least one read operation which is performed before each erase consumes some time. The time for a read is typically much smaller than the total erase operation time so the penalty is small. Moreover, since the read operation is only to find out whether the WL is programmed or not, it does not need to be highly accurate. Thus, in order to shorten the read time, the sensing time may be made smaller and 1-strobe read may be used instead of a default 2-strobe read.

In the example of FIG. 10A, the WLs were divided into four groups, based on which the appropriate Vsl was used for each group. However, in general we may have more or less than four groups. The optimal number of groups can be determined by the nature of the curve in FIG. 10A.

Moreover, whenever we move to the next group, Vsl was increased by a common increment ΔVsl. However, in general, the increment may be changed when we move between groups. For example, when moving from GRP0 to GRP1, ΔVsl=0.1 V may be used, while when moving from GRP1 to GRP2, ΔVsl=0.2 V may be used. Optimal values depend on how the groups of WLs are defined. This can be optimized on silicon.

Further, in the above example in which Vsl is changed to adjust the erase depth, we have assumed that all bit line erase-verify sensing is used. However, if source-follower erase-verify sensing is used, then Vtrip may be changed in the same manner as Vsl is changed. Vtrip will be raised as we move from one group to the next, so Vtrip is lower when the highest programmed group is closest to the drain side of the block. Also, in general, instead of changing the erase-verify voltage level (Vsl or Vtrip), other erase-verify sensing related parameters may be changed to obtain the same result. For example, in all bit line sensing, instead of increasing Vsl, the erase-verify sensing time may be lowered to raise a trip current Itrip, which makes erase-verify harder to pass (stricter) and thus essentially serves the same purpose as raising Vsl.

Figure 10B:
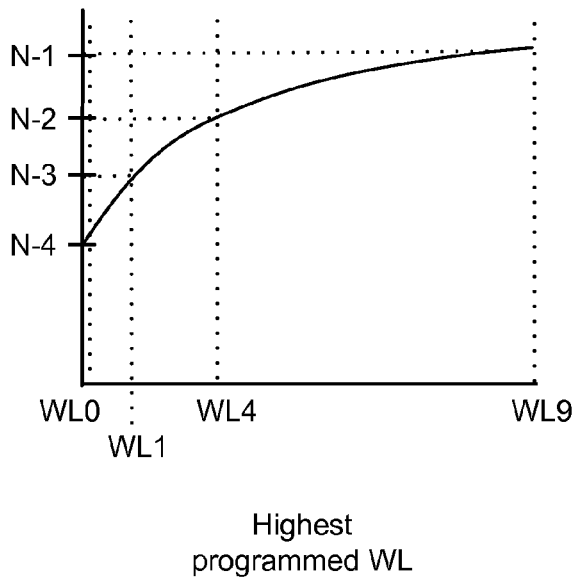
FIG. 10B depicts a relationship between a number of erase loops needed to complete an erase operation for a block and a highest programmed word line for the block, corresponding to a portion of the curve of FIG. 10A.

FIG. 10B depicts a relationship between a number of erase loops needed to complete an erase operation for a block and a highest programmed word line for the block, corresponding to a portion of the curve of FIG. 10A. WL0, WL1, WL4 and WL9 represent the predetermined word lines discussed in the example of FIG. 10A. A portion of the x-axis of FIG. 10A is shown in further detail in FIG. 10B.

Figure 10C:
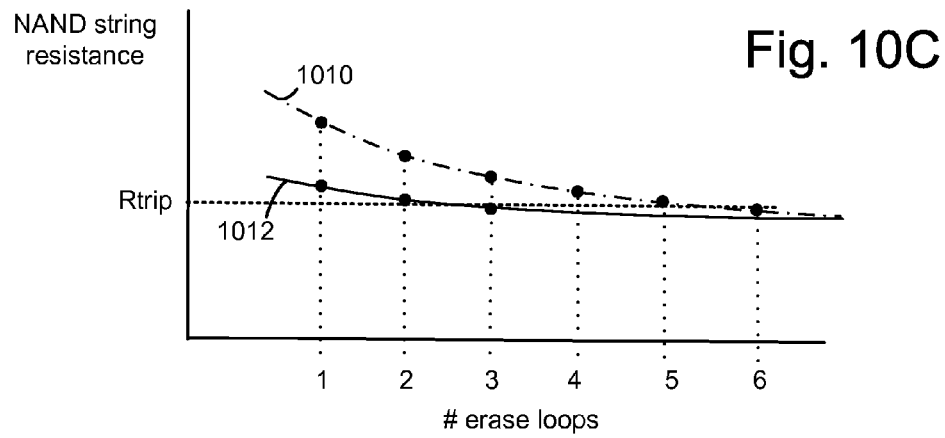
FIG. 10C depicts a relationship between a NAND string resistance during sensing and a number of erase loops needed to complete an erase operation for a block, for a fully programmed block (curve 1010) and a partially programmed block with WL0 programmed (curve 1012).

FIG. 10C depicts how a NAND string resistance during erase-verify sensing changes with each additional erase loop during an erase operation for a block, for a fully programmed block (curve 1010) and a partially programmed block with only WL0 programmed (curve 1012). The x-axis denotes the number of erase loops in an erase operation. The y-axis denotes NAND string resistance during a sensing operation in which a verify pulse is applied to one or more word lines after the erase pulse. The curve 1010 denotes the resistance versus number of erase loops for a fully programmed block. The curve 1012 denotes the resistance versus number of erase loops for a partially programmed block with only WL0 programmed. Rtrip denote a resistance threshold or trip level which the NAND string resistance must fall below in order for a erase-verify test to be passed.

In this example, after erase loops #1 and #2, the values of curves 1010 and 1012 are both higher than Rtrip so that the erase-verify test will be failed for the fully and partially programmed blocks. After erase loop #3, the value of curve 1010 is higher than Rtrip so that the erase-verify test will be failed for the fully programmed block. However, the value of curve 1012 is lower than Rtrip so that the erase-verify test will be passed for the partially programmed block. After erase loops #4 and #5, the value of curve 1010 is still higher than Rtrip so that the erase-verify test will continue to fail for the fully programmed block. Finally, after erase loop #6, the value of curve 1010 is lower than Rtrip so that the erase-verify test will be passed for the fully programmed block. Thus, it takes more erase loops to erase a fully programmed block than a partially programmed block. Moreover, it takes more erase loops to erase a partially programmed block in proportion to the degree in which the block is partially programmed, e.g., in proportion to the highest programmed word line in the block.

For the partially programmed block, since most of the WLs are already erased, the overall NAND string resistance is lower than for a fully programmed block, which makes it easier to pass the erase-verify test. In this example, the erase-verify test is passed after the third erase pulse for the partially programmed block, while it passes on the sixth erase pulse for the fully programmed block. This results in shallower erase depth on WL0 (the WL that was programmed in the partially programmed block before erase) for the partially programmed block, for instance, as compared to rest of the WLs, which can result in a higher fail bit count on WL0 after the next program operation. No such issue is seen for a fully programmed block because the erase depth on WL0 is similar to the erase depth on other WLs. Adjusting the sensing parameters such as Vsl for the partially programmed block can reduce the fail bit count, as discussed in connection with FIG. 10E.

Figure 10D:
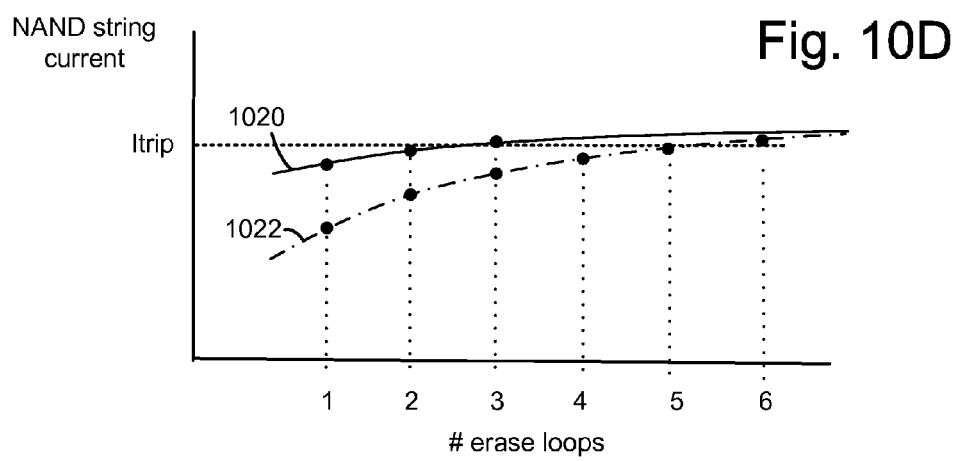
FIG. 10D depicts a relationship between a NAND string current (I) during sensing and a number of erase loops needed to complete an erase operation for a block, for a fully programmed block (curve 1022) and a partially programmed block with WL0 programmed (curve 1020).

FIG. 10D depicts how a NAND string current (I) during erase-verify sensing changes with each additional erase loop during an erase operation for a block, for a fully programmed block (curve 1022) and a partially programmed block with WL0 programmed (curve 1020). The x-axis denotes the number of erase loops in an erase operation, consistent with FIG. 10A. The y-axis denotes NAND string current (which is inversely proportional to the resistance of FIG. 10A) for a NAND string during a sensing operation in which a verify pulse is applied to one or more word lines. Itrip denote a current trip level which the NAND string current must exceed in order for a erase-verify test to pass. The curves of FIG. 10D are essentially a mirror image of those of FIG. 10C. Curve 1020 exceeds Itrip at erase loop #3, and curve 1022 exceeds Itrip at erase loop #6.

Figure 10E:
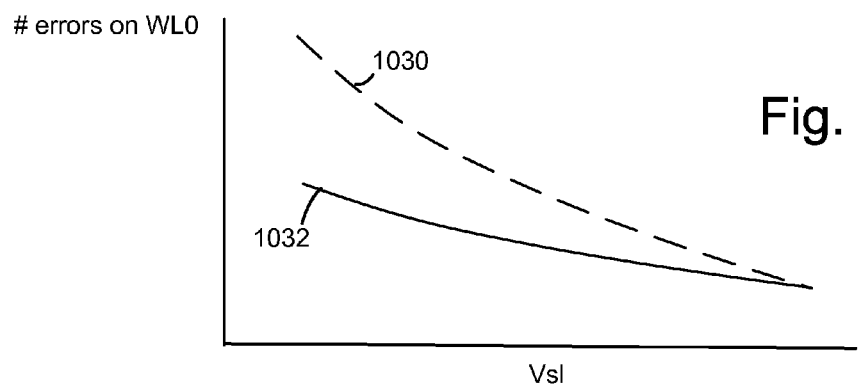
FIG. 10E depicts a number of errors on WL0 as a function of Vsl.

FIG. 10E depicts a number of errors (fail bit count) on WL0 as a function of Vsl used during the erase-verify test. Curve 1030 is the case of a partially programmed block with only WL0 programmed (a worst case), and curve 1032 is the case of a fully programmed block. This shows the impact of the discrepancy in erase depth between a partially programmed block and a fully programmed block. To obtain these curves, after a block (fully or partially programmed) was erased, it was fully programmed to random data and the number of E->X fail bits was measured (where X represents a programmed state). Typically, X=A, the lowest programmed state. This process was repeated at different Vsl values during erase-verify sensing. All bit line sensing was used in this example, which means the erase depth becomes deeper as we increase Vsl during erase-verify. As we increase Vsl, the error count decreases until the erase depth is sufficiently deep enough such that the E->X fails are purely program disturb dominated and hence independent of erase depth. It can be seen that a higher Vsl can be used for a partially programmed block to obtain the same number of fail bits as for a fully programmed block. This is a direct result of the difference in the erase loops that we obtain (at the same Vsl) for the partially programmed block and the fully programmed block.

Figure 10F:
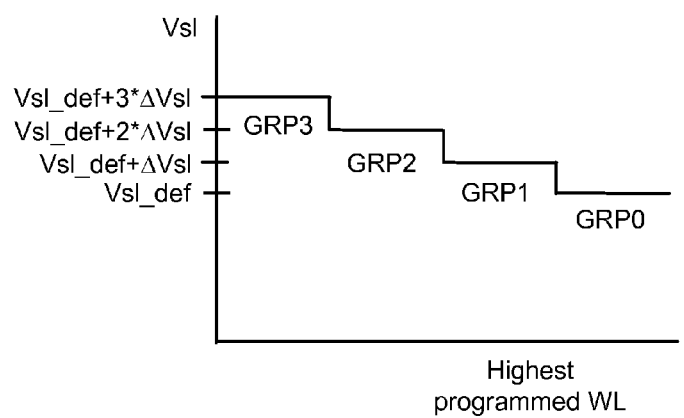
FIG. 10F depicts an adjusted value of Vsl as a function of a highest programmed word line or group in a block.

FIG. 10F depicts an adjusted value of Vsl as function of a highest programmed word line or group in a block. As discussed, a higher Vsl can be used when the highest programmed word line is closer to the source side of a NAND string or a block to make the sensing stricter. A default level, Vsl_def is depicted for the fully programmed block case (GRP0). Further, the increment between the Vsl levels can be uniform or varying. Here, Vsl_def is used for GRP0, Vsl_def+ΔVsl is used for GRP1, Vsl_def+2*ΔVsl is used for GRP2 and Vsl_def+3*ΔVsl is used for GRP3.

Figure 11A:
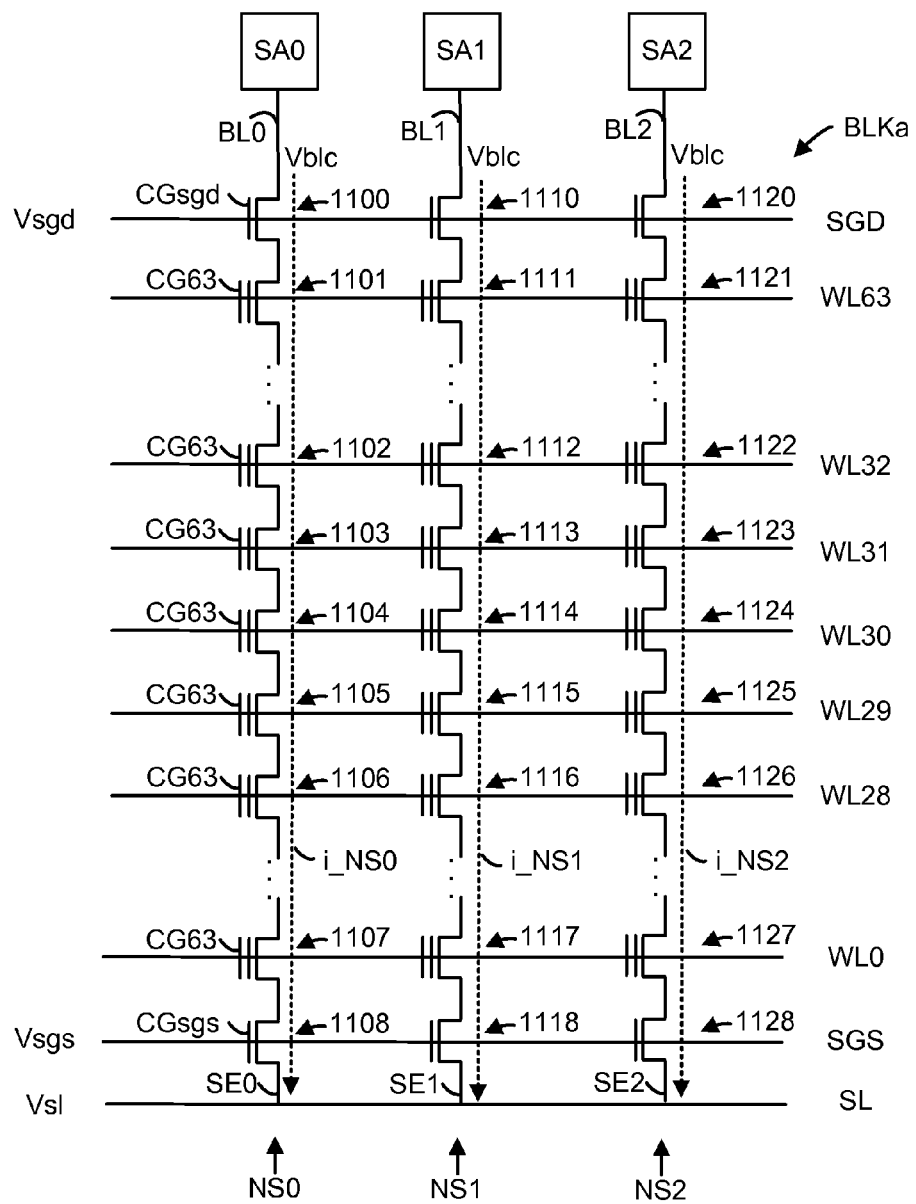
FIG. 11A depicts current flow in NAND strings during an example all bit line sensing process of an erase operation.

FIG. 11A depicts current flow in NAND strings during an example all bit line sensing process of an erase operation. BLKa includes example NAND strings NS0-NS2 and associated sense amplifiers SA0-SA2, respectively, connected to bit lines BL0-BL2, respectively. An SGD line is connected to control gates of SGD transistors 1100 (having example control gate CGsgd), 1110 and 1120. WL63 is connected to control gates of storage elements 1101 (having example control gate CG63), 1111 and 1121. WL32 is connected to control gates of storage elements 1102 (having example control gate CG32), 1112 and 1122. WL31 is connected to control gates of storage elements 1103 (having example control gate CG31), 1113 and 1123. WL30 is connected to control gates of storage elements 1104 (having example control gate CG30), 1114 and 1124. WL29 is connected to control gates of storage elements 1105 (having example control gate CG29), 1115 and 1125. WL28 is connected to control gates of storage elements 1106 (having example control gate CG28), 1116 and 1126. WL0 is connected to control gates of storage elements 1107 (having example control gate CG0), 1117 and 1127. An SGS line is connected to control gates of SGS transistors 1108 (having example control gate CGsgs), 1118 and 1128. The source ends SE0-SE2 of NS0-NS2, respectively, are connected to a common source line SL.

The sensing can be used to determine whether a block is partially programmed such as mentioned in connection with step 802 of FIG. 8A, steps 822 and 824 of FIG. 8B or steps 846 and 848 of FIG. 8C. Or, the sensing can be used to determine whether an erase operation is completed for a block, such as mentioned in connection with step 874 of FIG. 8D.

In an example sensing process referred as negative all bit line sensing, the current is sensed concurrently in each NAND string in a block, by the sense amplifiers associated with those NAND strings. For example, the current in NS0, NS1 and NS2 is i_NS0, i_NS1 and i_NS2, respectively, as sensed by sense amplifiers SA0, SA1 and SA2, respectively. Further, in a first approach, the storage elements of all of the word lines are verified concurrently. For example, to determine whether an erase operation is completed for a block, WL0-WL63 can receive Vv_erase such as 0 V. Or, to determine whether a block is partially programmed, a source-side sub-block of the word lines can receive Vread while a non-source side sub-block of the word lines receives Vv_dem. In a second approach, the storage elements of even-numbered word lines are verified concurrently, after which the storage elements of odd-numbered word lines are verified concurrently. When the storage elements of even-numbered word lines are verified, WL0, WL2, ..., WL62 can receive Vv_erase or Vv_dem while WL1, WL3, ..., WL63 can receive Vread. In a third approach, the storage elements of odd-numbered word lines are verified concurrently, after which the storage elements of even-numbered word lines are verified concurrently. Thus, regardless of whether all bit line sensing or even/odd (source-follower) sensing is used, a further option is to verify even-numbered and odd-numbered word lines together (referred to as all word line erase-verify) or to verify the even-numbered and odd-numbered word lines separately (referred to as alternate word line erase-verify). Verifying the even-numbered and odd-numbered word lines separately may improve write-erase endurance.

Vsl can be set to a level which is lower than Vbl so that a current flows from the drain end to the source end of a NAND string. In one example, Vsl=1.2 V and the bit lines are held at Vbl=1.8 V. The current in each NAND string flows through the associated bit lines and is sensed at the associated sense amplifier. If the sensed current exceeds a threshold or trip level (Itrip), the NAND string is judged to be in a conductive state. If the sensed current does not exceed the trip level, the NAND string is judged to be in a non-conductive state. The value of Itrip is determined by a sensing time (tsense) which can be set based on a ROM fuse parameter in the memory device. In one approach, Isense is inversely proportional to tsense.

An erase-verify test is judged to be passed when all, or almost all of the NAND strings (except for a small number of NAND strings which might be ignored), are judged to be in a conductive state. The erase depth can be controlled by setting Vsl. A higher Vsl results in a deeper erased depth because it makes the erase-verify test stricter (more difficult to pass, requiring more erase loops). See FIGS. 13A-13C for further details.

The SGD line and SGS line receive voltages Vsgd and Vsgs, respectively, which render these transistors in a conductive state.

Even though the sensing can be done in a different manner for the negative all bit line sensing scheme and source follower sensing scheme, for both schemes, the judgment of whether the NAND string in conductive or non-conductive is determined by the amount of current flowing through the NAND string. As seen in FIGS. 10C and 10D, the NAND string current is inversely proportional to the NAND string resistance. At each erase pulse, Verase is increased to erases the storage elements deeper, lowering their Vth and hence reducing the NAND string resistance. After a certain erase pulse, when the NAND string resistance reaches a sufficiently low value, the NAND string will be judged to be conductive, and the erase-verify test will be passed.

Figure 11B:
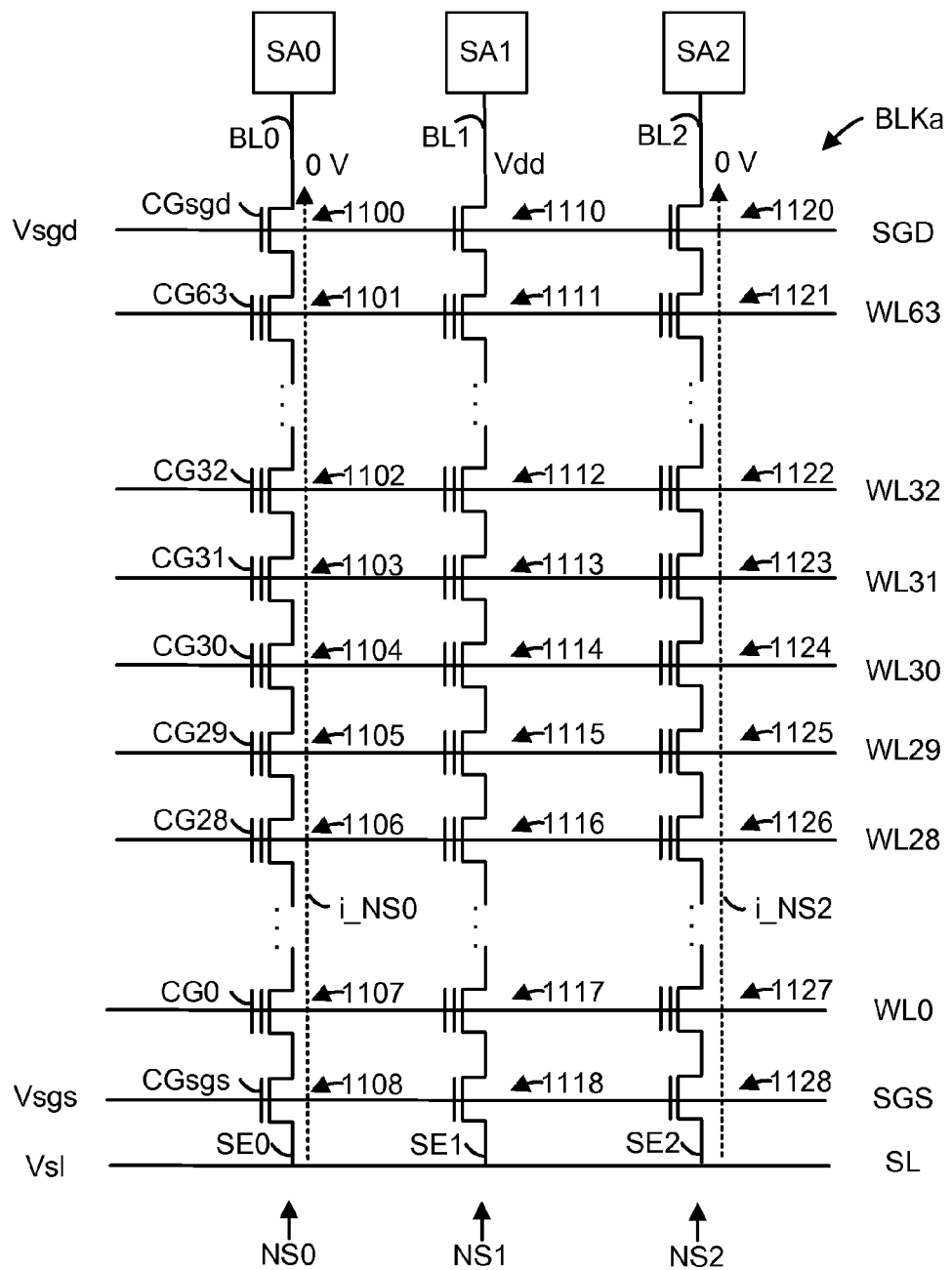
FIG. 11B depicts current flow in NAND strings during a sensing process of even-numbered bit lines in connection with an erase operation.

FIG. 11B depicts current flow in NAND strings during a sensing process of even-numbered bit lines in connection with an erase operation. Another type of sensing is source-follower sensing (also referred to as even/odd sensing) in which the SL is charged up to Vdd (e.g., 2.5 V) and the bit lines to be sensed (even-numbered bit lines in this example) are initially grounded. The SGD transistors are biased high enough to make them conductive, so that the NAND string cell current can flow through them. In this technique, the even- and odd-numbered bit lines can be verified separately to avoid the effects from neighboring bit line coupling. When even-numbered bit lines are verified, the odd-numbered bit lines are held at Vdd, to avoid unwanted current flowing through the odd-numbered bit lines. Similarly, when odd-numbered bit lines are verified, the even-numbered bit lines are held at Vdd. NAND string current flows from the source side to the drain side of a NAND string as indicated by currents i_NS0 and i_NS2 for NS0 and NS2, respectively. During sensing, the bit lines to be sensed, are left floating and are charged up because of current following from the source side to the drain side of the NAND string. After waiting for a certain time, the final Vbl level to which the bit line is charged is judged by the sense amplifier. The NAND string is judged to be in a conductive state if Vbl>Vtrip, where Vtrip can be set based on a ROM fuse parameter in the memory device.

An erase-verify test is judged to be passed when all, or almost all of the NAND strings (except for a small number of NAND strings which might be ignored), are judged to be in a conductive state. The erase depth can be controlled by setting Vtrip. A higher trip voltage results in a deeper erased depth because it makes the erase-verify test stricter and difficult to pass. See FIGS. 14A and 14B for further details. Also, the erase depth can be controlled by setting Vsl. A lower Vsl results in a deeper erased depth because it makes the erase-verify test stricter.

FIG. 11C depicts current flow in NAND strings during a sensing process of odd-numbered bit lines in connection with an erase operation, which in one approach is performed after a sensing process of even-numbered bit lines. When odd-numbered bit lines are verified, the even-numbered bit lines are held at Vdd. NAND string current flows from the source side to the drain side of a NAND string as indicated by current i_NS1 for NS1.

Figure 12:
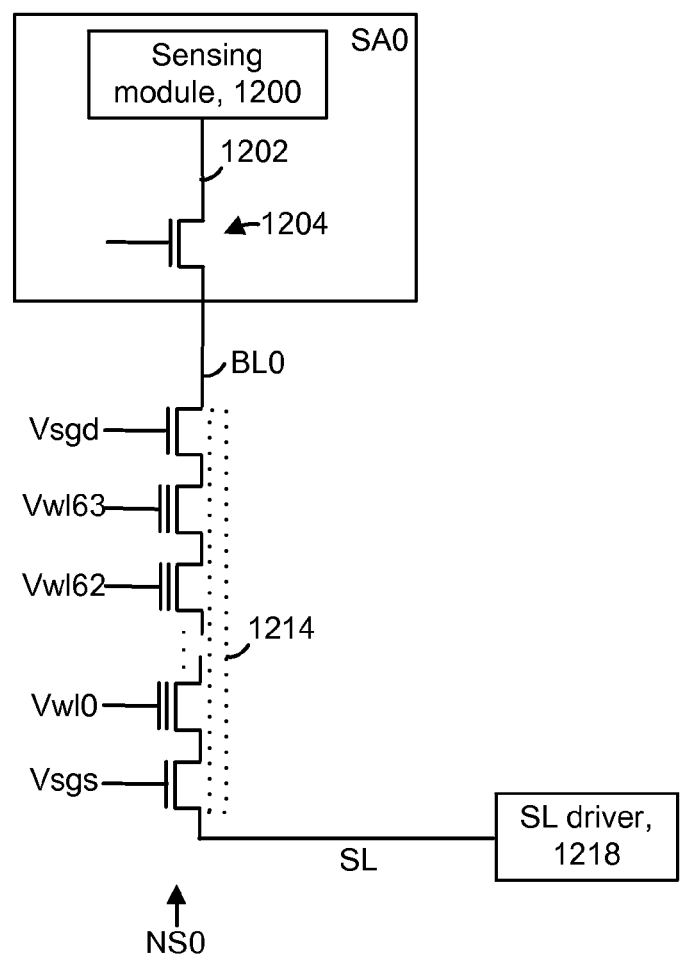
FIG. 12 depicts an example sensing circuit which includes the sense amplifier SA0 and NAND string NS0 of FIG. 3.

FIG. 12 depicts an example sensing circuit which includes the sense amplifier SA0 and NAND string NS0 of FIG. 3. NS0 is fabricated on a substrate and includes a channel region 1214 in the substrate. SA0 includes a sensing module 1200, a sense line 1202 and a transistor 1204 which is connected to BL0. A voltage on the bit line can be fixed or clamped to a desired level using the transistor 1204. A SL driver 1218 provides a voltage Vsl on the SL. In the all bit line sensing described in connection with FIG. 11A, the SL driver is used to set Vsl and the transistor 1204 is used to set Vbl. The transistor 1204 may be referred to as a bit line clamp (BLC) transistor. Depending on the conductive states of the storage elements in NS0, current may flow in the channel 1214 from the BL to the SL through the sense line. The sensing module can determine the amount of current (or at least, whether the current amount is below or above a certain current-trip level i.e., Itrip) on the sense line 1202 in different ways. In one possible approach, the sense module has a capacitor which is charged up. At t0, the capacitor is allowed to charge the sense line to a specified level. The voltage level is then determined to be above or below a trip voltage at a sense time. The current is determined to be above or below a trip current at the sense time according to whether the voltage level is below or above, respectively, the trip voltage. The sense module thus determines the current by pre-charging the sense line and subsequently determining a voltage drop which is tied to the current level. The sensing parameters can be adjusted by adjusting the pre-charge level or a trip level for the voltage drop.

Figure 13A:
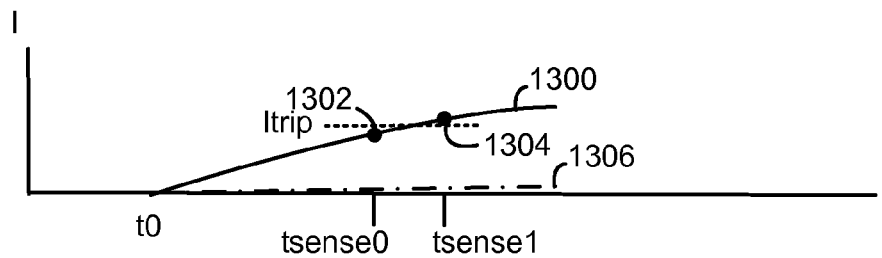
FIG. 13A depicts a sensed current for the sensing scheme of FIG. 11A, where a current sense time is an adjustable parameter.

FIG. 13A depicts a sensed current for the sensing scheme of FIG. 11A, where a current sense time is an adjustable parameter. During all bit line sensing, a current can flow in the NAND string starting at a time t0, when Vsl and Vbl are raised. A line 1300 represents a case where the NAND string is in a conductive state and a relatively large current flows. A line 1306 represents a case where the NAND string is in a non-conductive state and a relatively small current flows. At a sense time tsense0 or tsense1, line 1300 has a value at point 1302 (below a trip current Itrip) or 1304 (above Itrip), respectively. Thus, a relatively shorter sense time (tsense0) results in a determination that the NAND string is in a non-conductive state since I<Itrip, while a relatively longer sense time (tsense1) results in a determination that the NAND string is in a conductive state since I>Itrip.

Figure 13B:
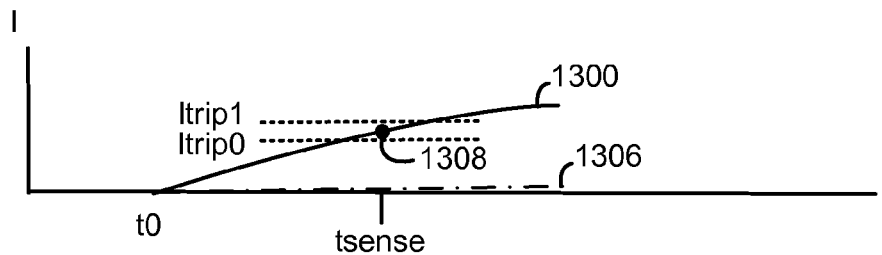
FIG. 13B depicts a sensed current for the sensing scheme of FIG. 11A, where a current trip level is an adjustable parameter.

FIG. 13B depicts a sensed current for the sensing scheme of FIG. 11A, where a current trip level is an adjustable parameter. The lines 1300 and 1306 are repeated. At a sense time tsense, line 1300 has a value at point 1308 which is above Itrip0 but below Itrip1. Thus, a relatively higher Itrip (Itrip1) results in a determination that the NAND string is in a non-conductive state, while a relatively lower Itrip (Itrip0) results in a determination that the NAND string is in a conductive state.

Figure 13C:
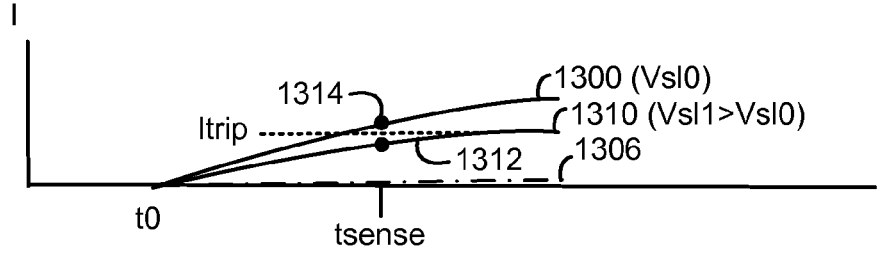
FIG. 13C depicts sensed currents for the sensing scheme of FIG. 11A, where a level of Vsl is an adjustable parameter.

FIG. 13C depicts sensed currents for the sensing scheme of FIG. 11A, where a level of Vsl is an adjustable parameter. The lines 1300 and 1306 are repeated. Line 1300 represents a case where Vsl=Vsl0, and line 1310 represents a case where Vsl=Vsl1>Vsl0. At a sense time tsense, line 1300 has a value at point 1314 which is above Itrip and line 1310 has a value at point 1312 which is below Itrip. Thus, a relatively lower Vsl (Vsl0) results in a determination that the NAND string is in a conductive state, while a relatively higher Vsl (Vsl1) results in a determination that the NAND string is in a non-conductive state.

Figure 14A:
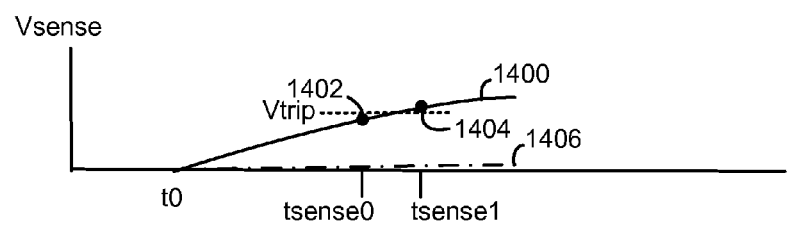
FIG. 14A depicts a sensed voltage for the sensing scheme of FIGS. 11B and 11C, where a voltage sense time is an adjustable parameter.

FIG. 14A depicts a sensed voltage for the sensing scheme of FIGS. 11B and 11C, where a voltage sense time is an adjustable parameter. During sensing of even- or odd-numbered bit lines, Vbl is sensed after Vsl is raised at to. A line 1400 represents a case where the NAND string is in a conductive state and a relatively large voltage (Vbl) is sensed. A line 1406 represents a case where the NAND string is in a non-conductive state and a relatively small Vbl is sensed. At a sense time tsense0 or tsense1, line 1400 has a value at point 1402 (below a trip voltage Vtrip) or 1404 (above Vtrip), respectively. Thus, a relatively shorter sense time (tsense0) results in a determination that the NAND string is in a non-conductive state since Vsense<Vtrip, while a relatively longer sense time (tsense1) results in a determination that the NAND string is in a conductive state since Vsense>Vtrip.

Figure 14B:
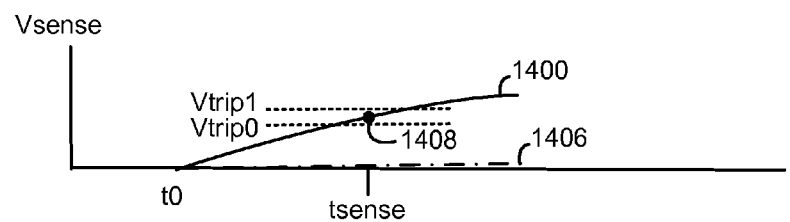
FIG. 14B depicts a sensed voltage for the sensing scheme of FIGS. 11B and 11C, where a voltage trip level is an adjustable parameter.

FIG. 14B depicts a sensed voltage for the sensing scheme of FIGS. 11B and 11C, where a voltage trip level is an adjustable parameter. The lines 1400 and 1406 are repeated. At a sense time tsense, line 1400 has a value at point 1408 which is above Vtrip0 but below Vtrip1. Thus, a relatively higher Vtrip (Vtrip1) results in a determination that the NAND string is in a non-conductive state, while a relatively lower Vtrip (Vtrip0) results in a determination that the NAND string is in a conductive state.

Figure 14C:
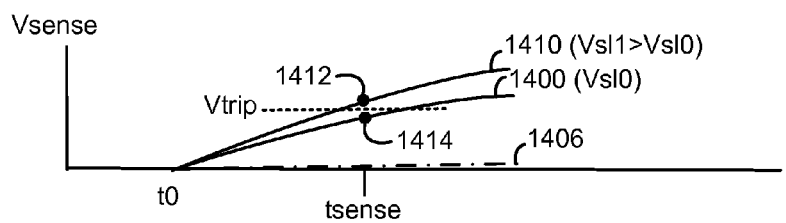
FIG. 14C depicts sensed voltages for the sensing scheme of FIGS. 11B and 11C, where a level of Vsl is an adjustable parameter.

FIG. 14C depicts sensed voltages for the sensing scheme of FIGS. 11B and 11C, where a level of Vsl is an adjustable parameter. The lines 1400 and 1406 are repeated. Line 1400 represents a case where Vsl=Vsl0, and line 1410 represents a case where Vsl=Vsl1>Vsl0. At a sense time tsense, line 1400 has a value at point 1414 which is below Vtrip and line 1410 has a value at point 1412 which is above Vtrip. Thus, a relatively lower Vsl (Vsl0) results in a determination that the NAND string is in a non-conductive state, while a relatively higher Vsl (Vsl1) results in a determination that the NAND string is in a conductive state.

Figure 15:
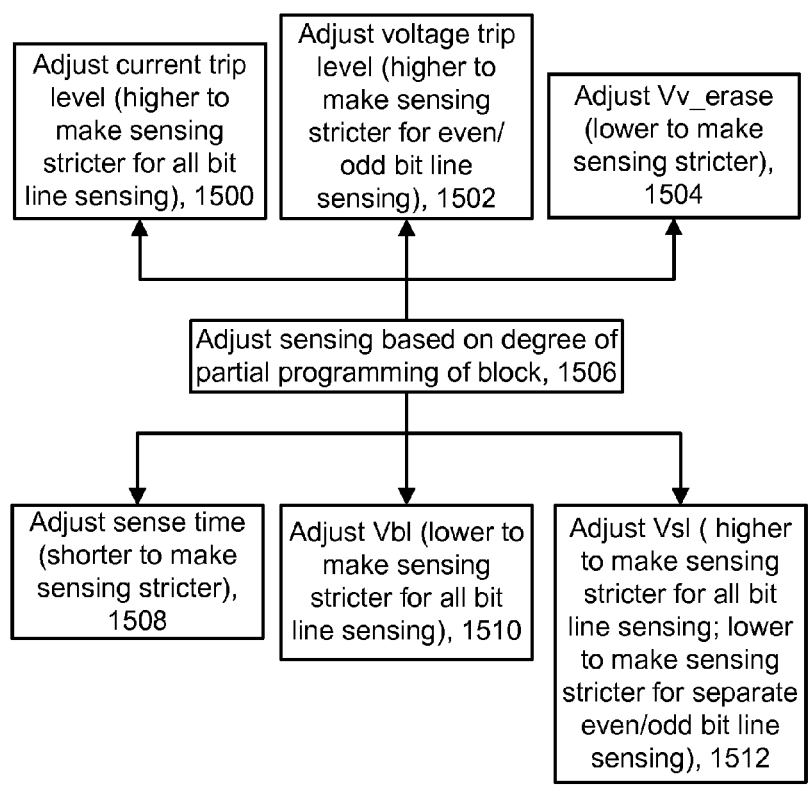
FIG. 15 depicts an example process for adjusting sensing parameters based on a degree of partial programming of a block to make the sensing more or less strict.

FIG. 15 depicts an example process for adjusting sensing parameters based on a degree of partial programming of a block to make the sensing more or less strict. Step 1506 involves adjusting the sensing based on the degree of partial programming of a block to make the sensing stricter when the degree of partial programming is lower, i.e., the portion of the block that is programmed is smaller (and the un-programmed portion is larger). Sensing that is relatively stricter results in a relatively deeper erase depth at which the erase-verify sensing passes successfully, e.g., a lower Vth, in the erased storage elements. This ensures that the erasing is sufficiently deep even when the degree of partial programming is low. Step 1506 can be implemented by one or more of the other steps. For example, these steps include: Adjust current trip level (higher to make sensing stricter for all bit line sensing), 1500; Adjust voltage trip level (higher to make sensing stricter for even/odd bit line sensing), 1502; Adjust Vv_erase (lower to make sensing stricter), 1504; Adjust Vread (lower to make sensing stricter), 1506; Adjust sense time (shorter to make sensing stricter), 1508; Adjust Vbl (lower to make sensing stricter for all bit line sensing), 1510; and Adjust Vsl (higher to make sensing stricter for all bit line sensing; lower to make sensing stricter for separate even/odd bit line sensing), 1512.

Regarding step 1500, FIG. 13B provides examples of different current trip levels Itrip0 and Itrip1. Additional current trip levels could be used as well. The erase-verify test of the sensing is stricter if Itrip is higher, for a given tsense. Regarding step 1502, FIG. 14B provides examples of different voltage trip levels Vtrip0 and Vtrip1. Additional voltage trip levels could be used as well. The erase-verify test of the sensing is stricter if Vtrip is higher, for a given tsense. Regarding step 1504, FIG. 6B provides an example of Vv_erase, the erase-verify voltage. The erase-verify test of the sensing is stricter if Vv_erase is lower, since the storage elements need to be erased more deeply to pass the erase-verify test. Regarding step 1508, FIGS. 13A and 14A provide examples of different sense times tsense0 and tsense1. Additional sense times could be used as well. The erase-verify test of the sensing is stricter if tsense is lower, for a given Itrip (FIG. 13A) or Vtrip (FIG. 14A). Regarding step 1510, in FIGS. 13A-13C, I is generated in proportion to Vbl, at a fixed Vsl. So, I will be greater when Vbl is greater, at a fixed Vsl. The erase-verify test of the sensing is stricter if Vbl is lower, for a given Itrip and tsense.

Regarding step 1512, for the all bit line sensing discussed in connection with FIGS. 13A-13C, I is generated in proportion to Vv_erase-Vsl. When Vsl is higher, the apparent Vth of the storage elements is raised. So I will be lower when Vsl is greater. Thus, the erase-verify test of the sensing is stricter if Vsl is greater, for a given Vbl, Itrip and tsense. For the even/odd bit line sensing discussed in connection with FIGS. 14A-14C, Vsense is generated in proportion to Vsl, so Vsense will be greater when Vsl is greater. The erase-verify test of the sensing is stricter if Vsl is lower, for a given Vtrip and tsense.

Accordingly, it can be seen that, in connection with an erase operation of a block of non-volatile storage elements, a determination is made as to whether the block is partially but not fully programmed. A degree of partial programming can be determined by a pre-erase read operation which determines a highest programmed word line, or which determines whether there is a programmed storage element in a word line above a small subset of source side word lines. Since a partially programmed block will erase more easily than a fully programmed block, a measure is taken to ensure that the block will be sufficiently deeply erased. In one approach, the erase-verify test in the erase operation is made stricter by adjusting a sensing parameter when the block is partially programmed. In another approach, the block can be programmed before being erased. Or, an extra erase pulse which is not followed by a erase-verify test can be applied. A combination of these approaches can be used as well. Advantages of the techniques include ensuring that a same or similar erase depth is achieved for a partially programmed block as for a fully programmed block, avoiding an increase in a fail bit count on a partially programmed word line after programming and improving overall reliability of the memory device.

In one embodiment, a method for erasing a block is provided. The block is formed on a substrate and comprises a string of non-volatile storage elements, and a plurality of word lines are connected to the non-volatile storage elements, where the word lines extend from a lowest word line at a source side of the block to a highest word line at a drain side of the block. The method comprises: in connection with an erase operation, determining a degree of partial programming of the block, the determining a degree of partial programming of the block comprises performing one or more read operations to identify a highest programmed word line among predetermined word lines of the plurality of word lines which are progressively further apart from one another, relative to the source side of the block; and in response to the determining the degree of partial programming of the block, applying an erase voltage to the substrate and subsequently performing a erase-verify test which tests a resistance in the string of non-volatile storage elements, the erase-verify test is configured according to the degree of partial programming of the block, such that the erase-verify test is relatively stricter when the degree of partial programming of the block is relatively low.

In another embodiment, a non-volatile storage device comprises: a block formed on a substrate, the block comprises a string of non-volatile storage elements; a plurality of word lines connected to the non-volatile storage elements, the word lines extend from a lowest word line at a source side of the block to a highest word line at a drain side of the block; and a control circuit. The control circuit: in connection with an erase operation, makes a determination of a degree of partial programming of the block, the determination is made by one or more read operations to identify a highest programmed word line among predetermined word lines of the plurality of word lines which are progressively further apart from one another, relative to the source side of the block, and in response to the determination of the degree of partial programming of the block, apply an erase voltage to the substrate and subsequently perform an erase-verify test which tests a resistance in the string of non-volatile storage elements, the erase-verify test is configured according to the degree of partial programming of the block, such that the erase-verify test is relatively stricter when the degree of partial programming of the block is relatively low.

In another embodiment, a method for erasing a block is provided, where the block is formed on a substrate and comprises a string of non-volatile storage elements, and a plurality of word lines are connected to the non-volatile storage elements, the word lines extend from a lowest word line at a source side of the block to a highest word line at a drain side of the block. The method comprises: in connection with an erase operation, performing a sensing operation to determine whether a non-source side adjacent subset of the string is erased, the non-source side adjacent subset of the string is not adjacent to the source side of the block, the performing the sensing operation comprises concurrently: (a) applying a demarcation control gate voltage (Vv_dem) to a plurality of non-volatile storage elements of the non-source side adjacent subset of the string, the demarcation control gate voltage demarcates between an erased state and a programmed state, (b) applying a read control gate voltage (Vread) to one or more non-volatile storage elements of a source side adjacent subset of the string, the source side adjacent subset of the string is adjacent to the source side of the block, the read control gate voltage renders the one or more non-volatile storage elements of the source side adjacent subset of the string in a conductive state, and (c) sensing a current in the string; and if the performing the sensing operation determines that the non-source side adjacent subset of the string is erased, determining that the string is partially but not fully programmed.

In another embodiment, a non-volatile storage device comprises: a block formed on a substrate, the block comprises a string of non-volatile storage elements; a plurality of word lines connected to the non-volatile storage elements, the word lines extend from a lowest word line at a source side of the block to a highest word line at a drain side of the block; and a control circuit. The control circuit: in connection with an erase operation, provides a performance of a sense operation to determine whether a non-source side adjacent subset of the string is erased, the non-source side adjacent subset of the string is not adjacent to the source side of the block, the performance of the sense operation is made by a concurrent: (a) application of a demarcation control gate voltage (Vv_dem) to a plurality of non-volatile storage elements of the non-source side adjacent subset of the string, the demarcation control gate voltage demarcates between an erased state and a programmed state, (b) application of a read control gate voltage (Vread) to one or more non-volatile storage elements of a source side adjacent subset of the string, the source side adjacent subset of the string is adjacent to the source side of the block, the read control gate voltage renders the one or more non-volatile storage elements of the source side adjacent subset of the string in a conductive state, and (c) a sense operation of a current in the string, and if the performance of the sense operation determines that the non-source side adjacent subset of the string is erased, determines that the string is partially but not fully programmed.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for erasing a block, the block is formed on a substrate and comprises a string of non-volatile storage elements, and a plurality of word lines are connected to the non-volatile storage elements, the word lines extend from a lowest word line at a source side of the block to a highest word line at a drain side of the block, the method comprising:

in connection with an erase operation, determining a degree of partial programming of the block, the determining a degree of partial programming of the block comprises performing one or more read operations to identify a highest programmed word line among predetermined word lines of the plurality of word lines which are progressively further apart from one another, relative to the source side of the block; and in response to the determining the degree of partial programming of the block, applying an erase voltage to the substrate and subsequently performing an erase-verify test which tests at least one of a resistance or a current in the string of non-volatile storage elements, the erase-verify test is configured according to the degree of partial programming of the block, such that the erase-verify test is relatively stricter when the degree of partial programming of the block is relatively low.

2. The method of claim 1, wherein:
the highest programmed word line among the predetermined word lines is a highest word line among the predetermined word lines comprising at least a specified count of programmed non-volatile storage elements.

3. The method of claim 1, wherein:
the performing one or more read operations comprises reading a word line of the predetermined word lines which is closest to the drain side of the block, determining if the word line of the predetermined word lines which is closest to the drain side of the block has at least a specified count of programmed non-volatile storage elements, and, if the word line of the predetermined word lines which is closest to the drain side of the block does not have at least the specified count of programmed non-volatile storage elements, proceeding to read one or more additional word lines of the predetermined word lines, in an order moving progressively away from the drain side of the block, until a word line of the predetermined word lines which has at least the specified count of programmed non-volatile storage elements is identified.

4. The method of claim 1, wherein:
the performing the erase-verify test comprises applying a voltage at a source end of the string of non-volatile storage elements, applying a voltage at a drain end of the string of non-volatile storage elements, where the voltage at the drain end of the string of non-volatile storage elements is greater than the voltage at the source end of the string of non-volatile storage elements, and sensing, at a sense time, a current in the string of non-volatile storage elements; and
the erase-verify test is configured according to the degree of partial programming of the block, such that a difference between the voltage at the drain end of the string of non-volatile storage elements and the voltage at the source end of the string of non-volatile storage elements is relatively higher when the degree of partial programming of the block is relatively lower.

5. The method of claim 1, wherein:
the performing the erase-verify test comprises applying a voltage at a source end of the string of non-volatile storage elements, applying a voltage at a drain end of the string of non-volatile storage elements, where the voltage at the drain end of the string of non-volatile storage elements is greater than the voltage at the source end of the string of non-volatile storage elements, and sensing, at a sense time, a current in the string of non-volatile storage elements; and
the erase-verify test is configured according to the degree of partial programming of the block, such that the sense time is relatively shorter when the degree of partial programming of the block is relatively lower.

6. The method of claim 1, wherein:
the performing the erase-verify test comprises applying a voltage at a source end of the string of non-volatile storage elements, applying a voltage at a drain end of the string of non-volatile storage elements, where the voltage at the drain end of the string of non-volatile storage elements is greater than the voltage at the source end of the string of non-volatile storage elements, and sensing, at a sense time, a current in the string of non-volatile storage elements; and
the erase-verify test is configured according to the degree of partial programming of the block, such that a trip level of the current is relatively higher when the degree of partial programming of the block is relatively lower.

7. The method of claim 1, wherein:
the performing the erase-verify test comprises applying a voltage at a source end of the string of non-volatile storage elements, floating a voltage at a drain end of the string of non-volatile storage elements, and sensing, at a sense time, the voltage at the drain end of the string of non-volatile storage elements; and
the erase-verify test is configured according to the degree of partial programming of the block, such that a trip level of the voltage at the drain end of the string of non-volatile storage elements is relatively higher when the degree of partial programming of the block is relatively lower.

8. The method of claim 1, wherein:
the performing the erase-verify test comprises applying an erase-verify voltage to the plurality of word lines; and
the erase-verify test is configured according to the degree of partial programming of the block, such that the erase-verify voltage is relatively lower when the degree of partial programming of the block is relatively lower.

9. A non-volatile storage device, comprising:
a block formed on a substrate, the block comprises a string of non-volatile storage elements;
a plurality of word lines connected to the non-volatile storage elements, the word lines extend from a lowest word line at a source side of the block to a highest word line at a drain side of the block; and
a control circuit, the control circuit: in connection with an erase operation, makes a determination of a degree of partial programming of the block, the determination is made by one or more read operations to identify a highest programmed word line among predetermined word lines of the plurality of word lines which are progressively further apart from one another, relative to the source side of the block, and in response to the determination of the degree of partial programming of the block, apply an erase voltage to the substrate and subsequently perform an erase-verify test which tests at least one of a resistance or a current in the string of non-volatile storage elements, the erase-verify test is configured according to the degree of partial programming of the block, such that the erase-verify test is relatively stricter when the degree of partial programming of the block is relatively low.

10. The non-volatile storage device of claim 9, wherein:
the performance of the one or more read operations is made by a read of a word line of the predetermined word lines which is closest to the drain side of the block, a determination of whether the word line of the predetermined word lines which is closest to the drain side of the block has at least a specified count of programmed non-volatile storage elements, and, if the word line of the predetermined word lines which is closest to the drain side of the block does not have at least the specified count of programmed non-volatile storage elements, proceeding to read one or more additional word lines of the predetermined word lines, in an order moving progressively away from the drain side of the block, until a word line of the predetermined word lines which has at least the specified count of programmed non-volatile storage elements is identified.

11. The non-volatile storage device of claim 9, wherein:
the performance of the erase-verify test comprises an application of a voltage at a source end of the string of non-volatile storage elements, an application of a voltage at a drain end of the string of non-volatile storage elements, where the voltage at the drain end of the string of non-volatile storage elements is greater than the voltage at the source end of the string of non-volatile storage elements, and a sense operation of, at a sense time, a current in the string of non-volatile storage elements, and the erase-verify test is configured according to the degree of partial programming of the block, such that a difference between the voltage at the drain end of the string of non-volatile storage elements and the voltage at the source end of the string of non-volatile storage elements is relatively higher when the degree of partial programming of the block is relatively lower.

12. The non-volatile storage device of claim 9, wherein:
the performance of the erase-verify test comprises an application of a voltage at a source end of the string of non-volatile storage elements, floating a voltage at a drain end of the string of non-volatile storage elements, and a sense operation of, at a sense time, the voltage at the drain end of the string of non-volatile storage elements, and the erase-verify test is configured according to the degree of partial programming of the block, such that a trip level of the voltage at the drain end of the string of non-volatile storage elements is relatively higher when the degree of partial programming of the block is relatively lower.

13. A method for erasing a block, the block is formed on a substrate and comprises a string of non-volatile storage elements, and a plurality of word lines are connected to the non-volatile storage elements, the word lines extend from a lowest word line at a source side of the block to a highest word line at a drain side of the block, the method comprising:
in connection with an erase operation, performing a sensing operation to determine whether a non-source side adjacent subset of the string is erased, the non-source side adjacent subset of the string is not adjacent to the source side of the block, the performing the sensing operation comprises concurrently: applying a demarcation control gate voltage to a plurality of non-volatile storage elements of the non-source side adjacent subset of the string, the demarcation control gate voltage demarcates between an erased state and a programmed state, applying a read control gate voltage to one or more non-volatile storage elements of a source side adjacent subset of the string, the source side adjacent subset of the string is adjacent to the source side of the block, the read control gate voltage renders the one or more non-volatile storage elements of the source side adjacent subset of the string in a conductive state, and sensing a current in the string; and
if the performing the sensing operation determines that the non-source side adjacent subset of the string is erased, determining that the string is partially but not fully programmed.

14. The method of claim 13, further comprising:
in response to the determining that the block is partially but not fully programmed, performing programming for the block as a precursor to an erase operation.

15. The method of claim 14, wherein:
the performing programming for the block comprises programming multiple non-volatile storage elements of the string concurrently.

16. The method of claim 13, wherein:
the non-source side adjacent subset of the string comprises a non-volatile storage element which is adjacent to the drain side of the block.

17. The method of claim 13, further comprising, in response to the determining that the block is partially but not fully programmed:
applying an erase voltage to the substrate and subsequently performing a erase-verify test; and
in response to the erase-verify test being passed, applying one or more additional erase pulses to the substrate without performing an associated erase-verify test.

18. A non-volatile storage device, comprising:
a block formed on a substrate, the block comprises a string of non-volatile storage elements;
a plurality of word lines connected to the non-volatile storage elements, the word lines extend from a lowest word line at a source side of the block to a highest word line at a drain side of the block; and
a control circuit, the control circuit: in connection with an erase operation, provides a performance of a sense operation to determine whether a non-source side adjacent subset of the string is erased, the non-source side adjacent subset of the string is not adjacent to the source side of the block, the performance of the sense operation is made by a concurrent: application of a demarcation control gate voltage to a plurality of non-volatile storage elements of the non-source side adjacent subset of the string, the demarcation control gate voltage demarcates between an erased state and a programmed state, application of a read control gate voltage to one or more non-volatile storage elements of a source side adjacent subset of the string, the source side adjacent subset of the string is adjacent to the source side of the block, the read control gate voltage renders the one or more non-volatile storage elements of the source side adjacent subset of the string in a conductive state, and a sense operation of a current in the string, and if the performance of the sense operation determines that the non-source side adjacent subset of the string is erased, determines that the string is partially but not fully programmed.

19. The non-volatile storage device of claim 18, wherein:
in response to the determining that the block is partially but not fully programmed, performing programming for the block as a precursor to an erase operation.

20. The non-volatile storage device of claim 18, wherein:
the control circuit, in response to the determination that the block is partially but not fully programmed, applies an erase voltage to the substrate and subsequently performs an erase-verify test, and in response to the erase-verify test being passed, applies one or more additional erase pulses to the substrate without performing an associated erase-verify test.

* * * * *